US012658130B2

(12) United States Patent
Kuang et al.

(10) Patent No.: US 12,658,130 B2
(45) Date of Patent: Jun. 16, 2026

(54) DISPLAY PANEL

(71) Applicant: Xiamen Tianma Display Technology Co., Ltd., Xiamen (CN)

(72) Inventors: Jian Kuang, Xiamen (CN); Yana Gao, Xiamen (CN); Xingyao Zhou, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/924,365

(22) Filed: Oct. 23, 2024

(65) Prior Publication Data

US 2025/0046252 A1 Feb. 6, 2025

(30) Foreign Application Priority Data

Dec. 28, 2023 (CN) .......................... 202311844363.9

(51) Int. Cl.
*G09G 3/3233* (2016.01)
*H10K 59/121* (2023.01)
(52) U.S. Cl.
CPC ....... *G09G 3/3233* (2013.01); *H10K 59/1213* (2023.02); *G09G 2300/0426* (2013.01); *G09G 2300/0452* (2013.01); *G09G 2300/0842* (2013.01); *G09G 2300/0861* (2013.01); *G09G 2310/08* (2013.01); *G09G 2320/0233* (2013.01); *G09G 2320/0242* (2013.01)
(58) Field of Classification Search
CPC ............... G09G 3/3233; G09G 3/3648; G09G 2300/0426; G09G 2300/0842
See application file for complete search history.

(56) References Cited

U.S. PATENT DOCUMENTS

2016/0035805 A1* 2/2016 Kim ................. H10K 59/80515
345/76
2024/0221573 A1* 7/2024 Liang ................... G09G 3/2007
2024/0312408 A1* 9/2024 Komazawa .......... G09G 3/3233
2024/0312410 A1* 9/2024 Liu ....................... G09G 3/3233

FOREIGN PATENT DOCUMENTS

CN 118968915 A * 11/2024 ........... G09G 3/3208

OTHER PUBLICATIONS

CN118968915A Display panel and display device Sun Pengju (Year: 2024).*

* cited by examiner

*Primary Examiner* — Van N Chow
(74) *Attorney, Agent, or Firm* — KDW Firm PLLC

(57) ABSTRACT

A display panel includes a light-emitting element and a pixel circuit. The pixel circuit includes a drive circuit and a coupling device. A control terminal of the drive circuit is electrically connected to a first node. A first terminal of the coupling device is electrically connected to a target voltage signal line, and a second terminal of the coupling device is electrically connected to the first node. The light-emitting element includes a first color light-emitting element and a second color light-emitting element. The pixel circuit includes a first pixel circuit and a second pixel circuit. The first pixel circuit is electrically connected to the first color light-emitting element, the second pixel circuit is electrically connected to the second color light-emitting element, and a capacitance value of a coupling device in the first pixel circuit is different from a capacitance value of a coupling device in the second pixel circuit.

24 Claims, 16 Drawing Sheets

10

1000

DISPLAY PANEL

CROSS-REFERENCE TO RELATED APPLICATION(S)

This application claims priority to Chinese Patent Application No. 202311844363.9 filed Dec. 28, 2023, the disclosure of which is incorporated herein by reference in its entirety.

TECHNICAL FIELD

The present application belongs to the field of display technology and, in particular, to a display panel and a display device.

BACKGROUND

With the continuous improvement of display technology, people's requirements for display panels are also constantly increasing. Among various display technologies, self-luminous display panels, which have advantages such as self-luminescence, lightness and thinness, low power consumption, high contrast ratio, high color gamut and implementable flexible display, have been widely applied to various electronic devices including electronic products such as computers and mobile phones.

Generally, self-luminous elements in the self-luminous display panels are organic light-emitting diodes (OLEDs), quantum-dot light-emitting diodes (QLEDs) and micro light-emitting diodes (microLEDs).

However, at present, some display panels such as the self-luminous display panels are prone to the problem of color cast, resulting in relatively poor display effects.

SUMMARY

Embodiments of the present application provide a display panel and a display device so that the problem of color cast of the display panel can be improved and a display effect of the display panel can be improved.

In a first aspect, embodiments of the present application provide a display panel. The display panel includes a light-emitting element and a pixel circuit. The pixel circuit includes: a drive circuit, where a control terminal of the drive circuit is electrically connected to a first node; and a coupling device, where a first terminal of the coupling device is electrically connected to a target voltage signal line, and a second terminal of the coupling device is electrically connected to the first node. The light-emitting element includes a first color light-emitting element and a second color light-emitting element, and the pixel circuit includes a first pixel circuit and a second pixel circuit, where the first pixel circuit is electrically connected to the first color light-emitting element, the second pixel circuit is electrically connected to the second color light-emitting element, and a capacitance value of a coupling device in the first pixel circuit is different from a capacitance value of a coupling device in the second pixel circuit.

In a second aspect, based on the same inventive concept, embodiments of the present application provide a display device. The display device includes the display panel provided in the first aspect.

BRIEF DESCRIPTION OF DRAWINGS

To illustrate technical solutions in embodiments of the present application more clearly, the drawings used in the description of the embodiments are briefly described below. Those skilled in the art may obtain other drawings based on the drawings described below on the premise that no creative work is done.

DETAILED DESCRIPTION

Figure 1:
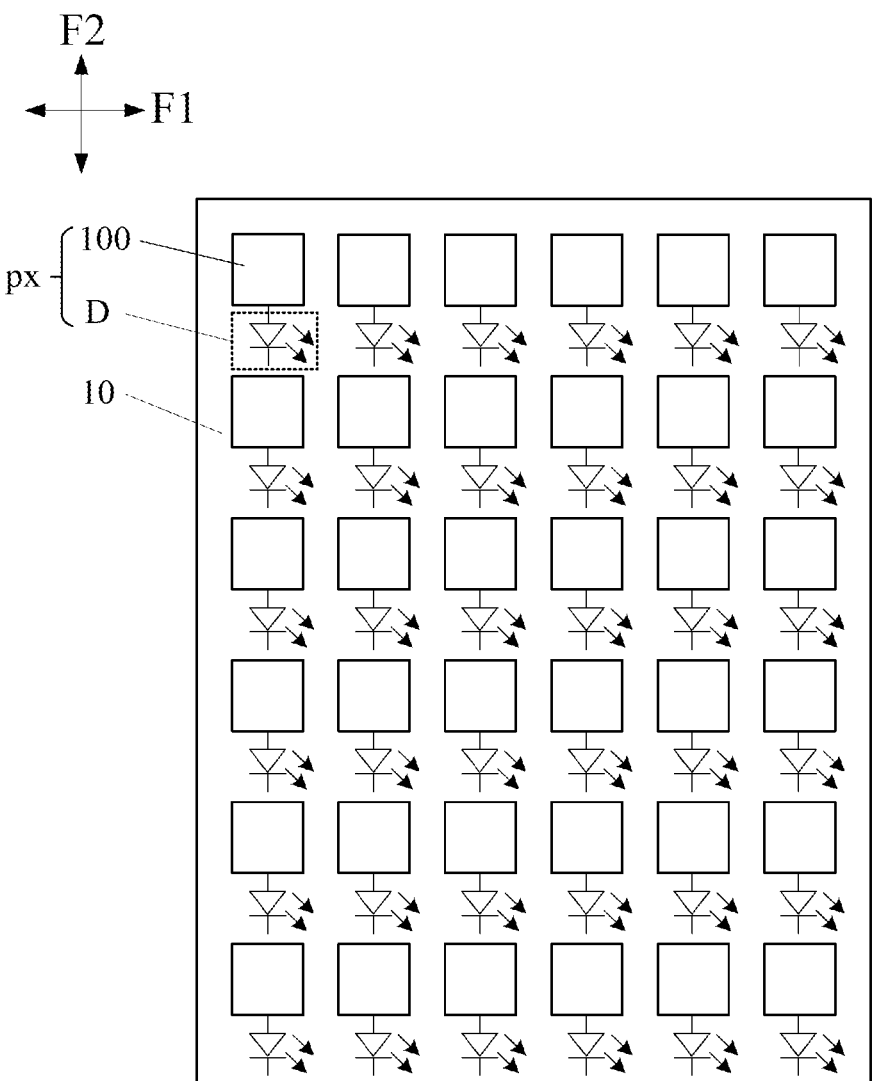
FIG. 1 is a circuit diagram of a display panel according to an embodiment of the present application.

Features and example embodiments in various aspects of the present application are described hereinafter in detail. To provide a clearer understanding of the objects, technical solutions, and advantages of the present application, the present application is further described in detail in conjunction with drawings and embodiments. It is to be understood that the embodiments set forth below are intended to illustrate and not to limit the present application. To those skilled in the art, the present application may be implemented with no need for some of these specific details. The description of the embodiments hereinafter is intended merely to provide a better understanding of the present application through examples of the present application.

It is to be noted that herein, relationship terms such as first and second are used merely for distinguishing one entity or operation from another and do not necessarily require or imply any such actual relationship or order between these entities or operations. Furthermore, the term "comprising", "including", or any other variant thereof is intended to encompass a non-exclusive inclusion so that a process, method, article, or device that includes a series of elements not only includes the expressly listed elements but also includes other elements that are not expressly listed or are inherent to such a process, method, article, or device. In the absence of more restrictions, the elements defined by the statement "including . . . " do not exclude the presence of additional identical elements in the process, method, article, or device that includes the elements.

It is to be understood that the term "and/or" used herein merely describes the association relationships between associated objects and indicates that three relationships may exist. For example, A and/or B may indicate three cases: A exists alone, A and B both exist, and B exists alone. In addition, the character "/" herein generally indicates that the front and rear associated objects are in an "or" relationship.

It is to be noted that a transistor in embodiments of the present application may be an n-type transistor or a p-type transistor. For an n-type transistor, an on level is a high level, and an off level is a low level. That is, when the gate of the n-type transistor is at a high level, the first electrode and the second electrode are turned on; and when the gate of the n-type transistor is at a low level, the first electrode and the second electrode are turned off. For a p-type transistor, an on level is a low level, and an off level is a high level. That is, when the control electrode of the p-type transistor is at a low level, the first electrode and the second electrode are turned on; and when the control terminal of the p-type transistor is at a high level, the first electrode and the second electrode are turned off. During specific implementation, the gate of each of the preceding transistors is used as the control electrode; moreover, according to the signal and type of the gate of each transistor, the first electrode may be used as the source and the second electrode may be used as the drain, or the first electrode may be used as the drain and the second electrode may be used as the source, and no distinction is made here. In addition, in the embodiments of the present disclosure, the on level refers to any level that can make the transistor turned on, and the off level refers to any level that can make the transistor cut off/turned off.

In the embodiments of the present application, the term "electrically connected" may refer to a direct electrical connection between two assemblies or may refer to an electrical connection between two assemblies via one or more other assemblies.

In the embodiments of the present application, the first node, the second node, and the third node are defined merely for the convenience of describing the circuit structure, and the first node, the second node, and the third node are not actual circuit units.

Before the technical solutions provided in the embodiments of the present application are explained, to facilitate the understanding of the embodiments of the present application, the present application first specifically explains the problems existing in the related art.

With the rapid development of display technology, applications of new display panels such as organic light-emitting diode (OLED) display panels, quantum-dot light-emitting diode (QLED) display panels and micro light-emitting diodes (microLEDs) are increasingly widespread.

The display panel may include sub-pixels of a plurality of colors. The sub-pixel may include a pixel circuit and a light-emitting element. In actual display, the pixel circuit generally outputs a drive current to drive the light-emitting element to emit light. Light-emitting elements of different colors generally have different luminescence efficiency. When the drive current output by the pixel circuit is relatively low (insufficient), brightness of light-emitting elements of some colors may be higher than brightness of light-emitting elements of other colors, resulting in the problem of color cast.

An expression of the drive current of the pixel circuit is as follows:

$$I_{ds} = \frac{1}{2}k(V_{PVDD} - V_{data})^2 \tag{1}$$

where $I_{ds}$ denotes the drive current of the pixel circuit, k denotes a coefficient, $V_{PVDD}$ denotes a voltage value of a positive power voltage signal, and $V_{data}$ denotes a data voltage.

That is, a magnitude of the drive current $I_{ds}$ of the pixel circuit is affected by the voltage value $V_{PVDD}$ of the positive power voltage signal and the data voltage $V_{data}$. To reduce the power consumption of the display panel, the voltage value $V_{PVDD}$ of the positive power voltage signal may drop. However, in this manner, to ensure that the drive current output by the pixel circuit can meet a requirement, for example, to ensure that a maximum drive current output by the pixel circuit can meet a requirement for high brightness, the data voltage $V_{data}$ needs to drop. However, at present, a driver chip can generally only output a data voltage with a positive voltage value (a voltage value greater than 0 V). Therefore, once the data voltage drops to 0 V or approaches 0 V, the data voltage cannot continue to drop. In this manner, the drive current output by the pixel circuit is insufficient, that is, a current value of the drive current output by the pixel circuit cannot reach an expected target current value. Light-emitting elements of different colors generally have different luminescence efficiency. Therefore, when the drive current output by the pixel circuit is relatively low (insufficient), brightness of light-emitting elements of some colors with relatively low luminescence efficiency may not reach expected target brightness, resulting in the problem of color cast.

In view of the preceding research findings of the inventors, the embodiments of the present application provide a display panel and a display device, so as to solve the technical problems that the display panel is prone to the color cast and a display effect is relatively poor in the related art.

The display panel provided in the embodiment of the present application is first described below.

FIG. 1 is a circuit diagram of a display panel according to an embodiment of the present application. As shown in FIG.

1, the display panel 10 provided in the embodiment of the present application may include a light-emitting element D and a pixel circuit 100. In some examples, the display panel 10 may include an organic light-emitting diode (OLED) display panel, a quantum-dot light-emitting diode (QLED) display panel or a micro light-emitting diode (microLED).

As shown in FIG. 1, in some embodiments, the display panel 10 may include a plurality of sub-pixels px arranged crosswise in a row direction F1 and a column direction F2. Here, colors of the plurality of sub-pixels px are not limited. For example, the display panel 10 may include sub-pixels px of a plurality of colors. The sub-pixel px may include the pixel circuit 100 and the light-emitting element D electrically connected to the pixel circuit 100.

Figure 2:
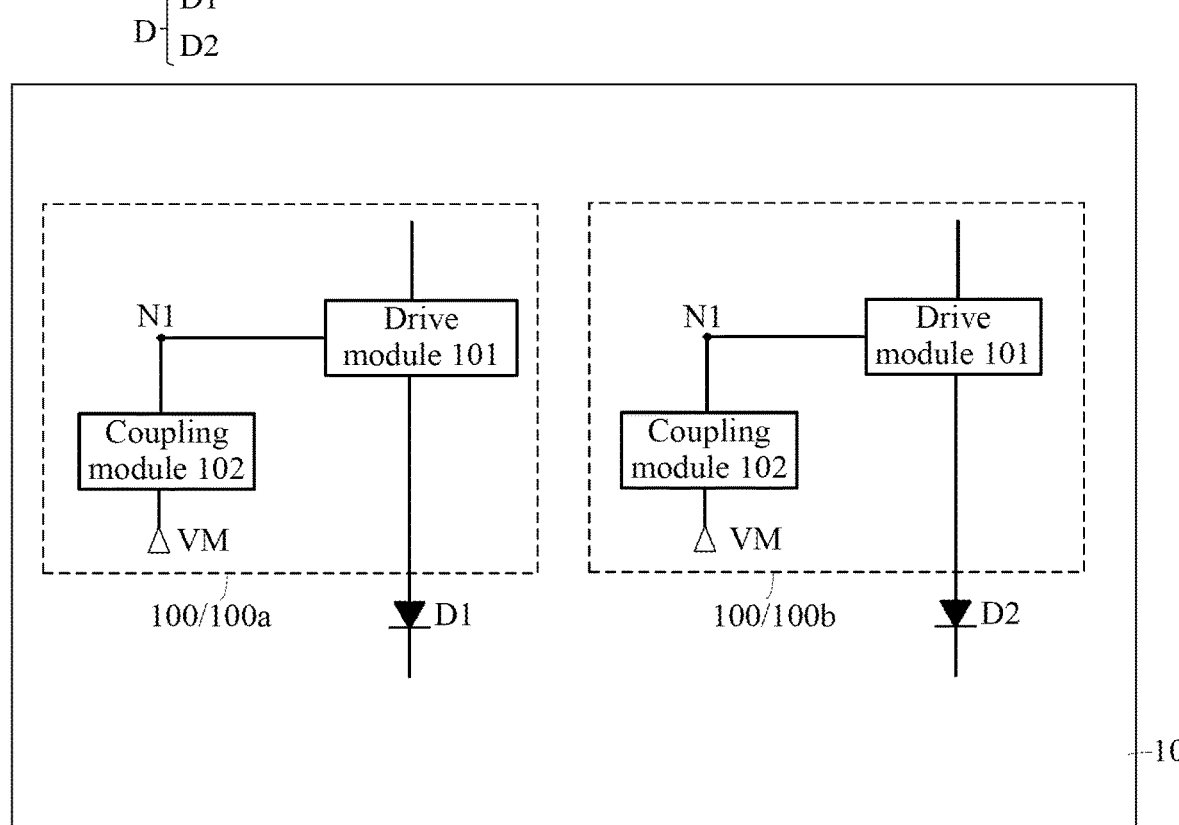
FIG. 2 is a partial circuit diagram of a display panel according to an embodiment of the present application.

FIG. 2 is a partial circuit diagram of a display panel according to an embodiment of the present application. As shown in FIG. 2, the pixel circuit 100 may include a drive circuit 101 and a coupling device 102. A control terminal of the drive circuit 101 may be electrically connected to a first node N1. The drive circuit 101 may be turned on under control of the first node N1 to provide a drive current to the light-emitting element D.

A first terminal of the coupling device 102 may be electrically connected to a target voltage signal line VM, and a second terminal of the coupling device 102 may be electrically connected to the first node N1. The coupling device 102 may be configured to adjust a potential of the first node N1 through coupling. For example, when a target voltage signal output by the target voltage signal line VM is switched from a high level to a low level, the coupling device 102 may pull down the potential of the first node N1 through the coupling. For example, when a target voltage signal output by the target voltage signal line VM is switched from a low level to a high level, the coupling device 102 may pull up the potential of the first node N1 through the coupling.

The light-emitting element D may include a first color light-emitting element D1 and a second color light-emitting element D2. The first color light-emitting element D1 and the second color light-emitting element D2 are light-emitting elements D of different colors. The pixel circuit 100 may include a first pixel circuit 100a and a second pixel circuit 100b. It is to be noted that for simplicity of illustration, only one first color light-emitting element D1, one second color light-emitting element D2, one first pixel circuit 100a and one second pixel circuit 100b in the display panel 10 are illustrated in FIG. 2. In practical application, the display panel 10 may include a plurality of first color light-emitting elements D1, a plurality of second color light-emitting elements D2, a plurality of first pixel circuits 100a and a plurality of second pixel circuits 100b.

The first pixel circuit 100a may be electrically connected to the first color light-emitting element D1 and may be configured to drive the first color light-emitting element D1 to emit light. The second pixel circuit 100b may be electrically connected to the second color light-emitting element D2 and may be configured to drive the second color light-emitting element D2 to emit light.

A capacitance value of a coupling device 102 in the first pixel circuit 100a may be different from a capacitance value of a coupling device 102 in the second pixel circuit 100b. Since the capacitance value of the coupling device 102 in the first pixel circuit 100a is different from the capacitance value of the coupling device 102 in the second pixel circuit 100b, a voltage adjustment amount of the coupling device 102 in the first pixel circuit 100a for a potential of a first node N1 in the first pixel circuit 100a may be different from a voltage adjustment amount of the coupling device 102 in the second pixel circuit 100b for a potential of a first node N1 in the second pixel circuit 100b. That is, the potential of the first node N1 in the first pixel circuit 100a and the potential of the first node N1 in the second pixel circuit 100b may be differently adjusted, which is conducive to enabling a drive current output by a drive circuit 101 in the first pixel circuit 100a and a drive current output by a drive circuit 101 in the second pixel circuit 100b to reach target drive currents of respective expected current values, so that the first color light-emitting element D1 and the second color light-emitting element D2 can reach or approach respective expected target brightness, thereby improving the problem of color cast.

According to the display panel provided in the embodiment of the present application, on the one hand, a potential of the control terminal (i.e., the first node) of the drive circuit may be adjusted through the coupling of the coupling device, which is conducive to adjusting the drive current output by the drive circuit, so that brightness of the light-emitting element reaches or approaches expected target brightness. On the other hand, for the first color light-emitting element and the second color light-emitting element of different colors, the capacitance value of the coupling device in the first pixel circuit and the capacitance value of the coupling device in the second pixel circuit are differently designed, and the potential of the first node in the first pixel circuit and the potential of the first node in the second pixel circuit may be differently adjusted, so that the drive current output by the drive circuit in the first pixel circuit and the drive current output by the drive circuit in the second pixel circuit can reach the target drive currents of the respective expected current values and the first color light-emitting element and the second color light-emitting element can reach or approach the respective expected target brightness, thereby improving the problem of color cast and improving a display effect of the display panel. On the other hand, in the case where the drive current output by the drive circuit is adjusted through the coupling of the coupling device, it is conducive to dropping a voltage value of a power voltage signal (for example, a positive power voltage signal) provided to the pixel circuit, thereby reducing power consumption.

Therefore, in the embodiment of the present application, in the case where a voltage value of the positive power voltage signal drops and a data voltage is not a negative value, the capacitance value of the coupling device in the first pixel circuit and the capacitance value of the coupling device in the second pixel circuit may be differently designed so that the first color light-emitting element and the second color light-emitting element can reach or approach the respective expected target brightness, thereby improving the problem of color cast and improving the display effect of the display panel.

Figure 3:
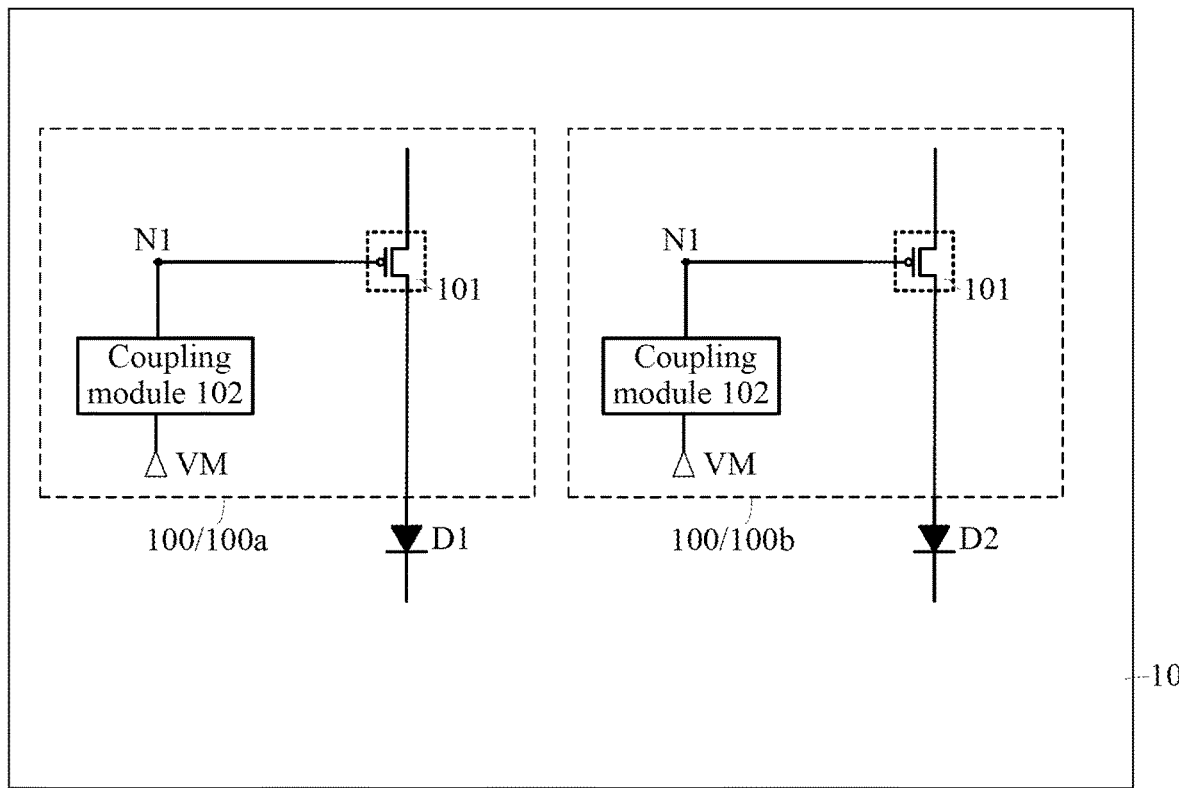
FIG. 3 is another partial circuit diagram of a display panel according to an embodiment of the present application.
Figure 4:
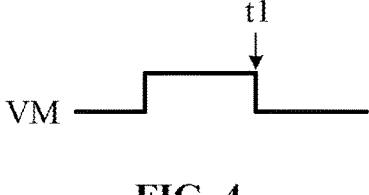
FIG. 4 is a drive timing diagram of a target voltage signal line in a display panel according to an embodiment of the present application.

FIG. 3 is another partial circuit diagram of a display panel according to an embodiment of the present application. FIG. 4 is a drive timing diagram of a target voltage signal line in a display panel according to an embodiment of the present application. As shown in FIG. 3, according to some embodiments of the present application, optionally, the drive circuit 101 may include a p-type transistor. A type of a transistor of the drive circuit 101 in the first pixel circuit 100a is the same as a type of a transistor of the drive circuit 101 in the second pixel circuit 100b. For example, in the embodiment shown in FIG. 3, the drive circuit 101 in the first pixel circuit 100a and the drive circuit 101 in the second pixel circuit 100b are both p-type transistors.

In conjunction with FIGS. 3 and 4, in a coupling stage (or referred to as a coupling moment) t1, a potential of the target voltage signal line VM may be switched from a high level to a low level. Correspondingly, the coupling device 102 may be configured to pull down the potential of the first node N1 in response to a potential variation of the target voltage signal line VM.

The case where the drive circuit 101 is the p-type transistor is used as an example, an expression of the drive current output by the drive circuit 101 in the pixel circuit 100 in the embodiment of the present application is as follows:

$$I'_{ds} = \frac{1}{2}k(V_{PVDD} - V_{data} - \Delta V)^2 \qquad (2)$$

where $I_{ds}'$ denotes the drive current output by the drive circuit 101 in the pixel circuit 100, k represents a coefficient, $V_{PVDD}$ denotes the voltage value of the positive power voltage signal, $V_{data}$ denotes the data voltage, and $\Delta V$ denotes a voltage adjustment amount of the coupling of the coupling device 102 for the potential of the first node N1 in the pixel circuit 100, that is, a coupling voltage.

As can be seen from this, when the drive circuit 101 is the p-type transistor, the potential of the first node N1 may be pulled down through the coupling of the coupling device 102, and the drive current output by the drive circuit 101 in the pixel circuit 100 may be increased, so that the brightness of the light-emitting element D reaches or approaches the expected target brightness.

In some examples, it is assumed that the voltage adjustment amount of coupling of the coupling device 102 in the first pixel circuit 100a for the potential of the first node N1 in the first pixel circuit 100a is ΔV1 and that the voltage adjustment amount of coupling of the coupling device 102 in the second pixel circuit 100b for the potential of the first node N1 in the second pixel circuit 100b is ΔV2. ΔV1≠ΔV2.

In this manner, the potential of the first node in the first pixel circuit and the potential of the first node in the second pixel circuit are differently adjusted so that the drive current output by the drive circuit in the first pixel circuit and the drive current output by the drive circuit in the second pixel circuit can reach the target drive currents of the respective expected current values and the first color light-emitting element and the second color light-emitting element can reach or approach the respective expected target brightness, thereby improving the problem of color cast and improving the display effect of the display panel.

Figure 5:
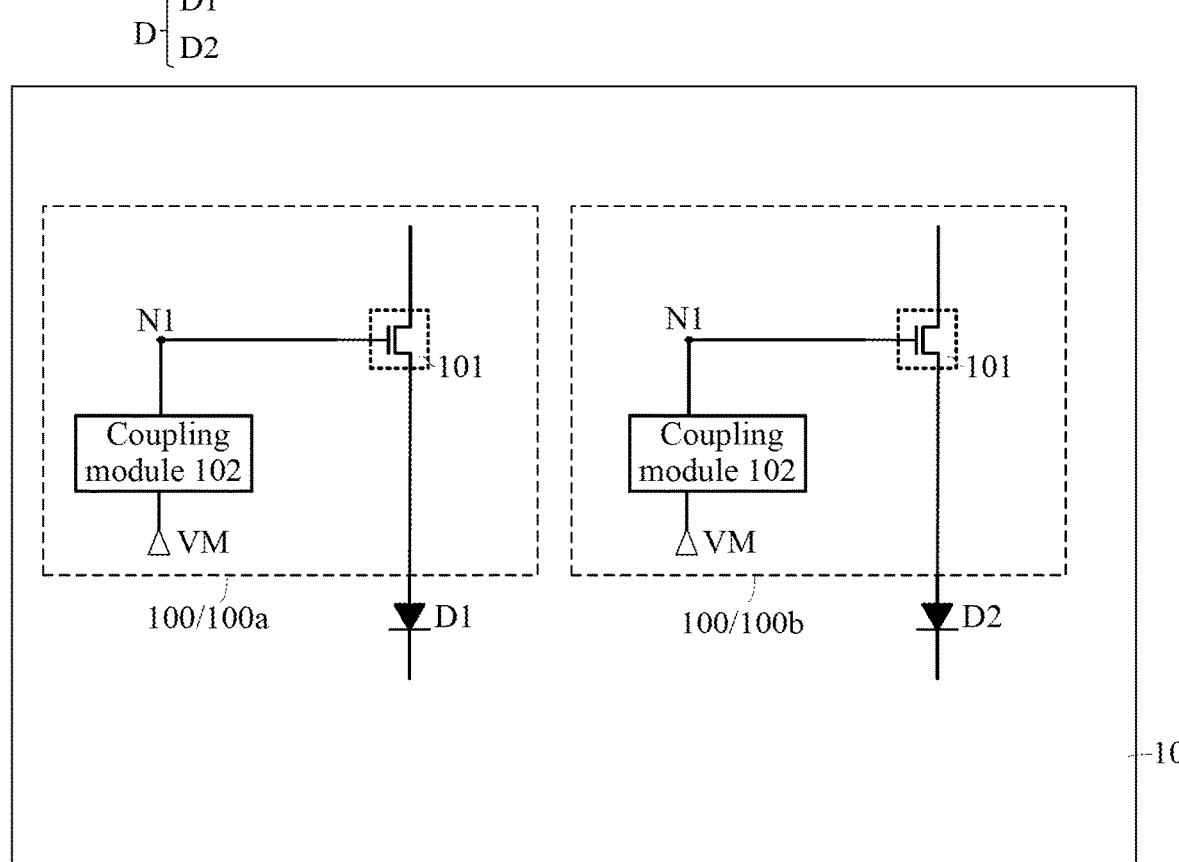
FIG. 5 is another partial circuit diagram of a display panel according to an embodiment of the present application.

FIG. 5 is another partial circuit diagram of a display panel according to an embodiment of the present application. As shown in FIG. 5, according to some other embodiments of the present application, optionally, the drive circuit 101 may include an n-type transistor. A type of a transistor of the drive circuit 101 in the first pixel circuit 100a is the same as a type of a transistor of the drive circuit 101 in the second pixel circuit 100b. For example, in the embodiment shown in FIG. 5, the drive circuit 101 in the first pixel circuit 100a and the drive circuit 101 in the second pixel circuit 100b are both n-type transistors.

In a coupling stage (or referred to as a coupling moment), a potential of the target voltage signal line VM may be switched from a low level to a high level. Correspondingly, the coupling device 102 may be configured to pull up the potential of the first node N1 in response to a potential variation of the target voltage signal line VM.

In this manner, when the drive circuit 101 is the n-type transistor, the potential of the first node N1 may be pulled up through the coupling of the coupling device 102, and the drive current output by the drive circuit 101 in the pixel circuit 100 may be increased, so that the brightness of the light-emitting element D reaches or approaches the expected target brightness.

In some examples, it is assumed that the voltage adjustment amount of coupling of the coupling device 102 in the first pixel circuit 100a for the potential of the first node N1 in the first pixel circuit 100a is ΔV1' and that the voltage adjustment amount of coupling of the coupling device 102 in the second pixel circuit 100b for the potential of the first node N1 in the second pixel circuit 100b is ΔV2'. ΔV1'≠ΔV2'.

In this manner, the potential of the first node in the first pixel circuit and the potential of the first node in the second pixel circuit are differently adjusted so that the drive current output by the drive circuit in the first pixel circuit and the drive current output by the drive circuit in the second pixel circuit can reach the target drive currents of the respective expected current values and the first color light-emitting element and the second color light-emitting element can reach or approach the respective expected target brightness, thereby improving the problem of color cast and improving the display effect of the display panel.

Figure 6:
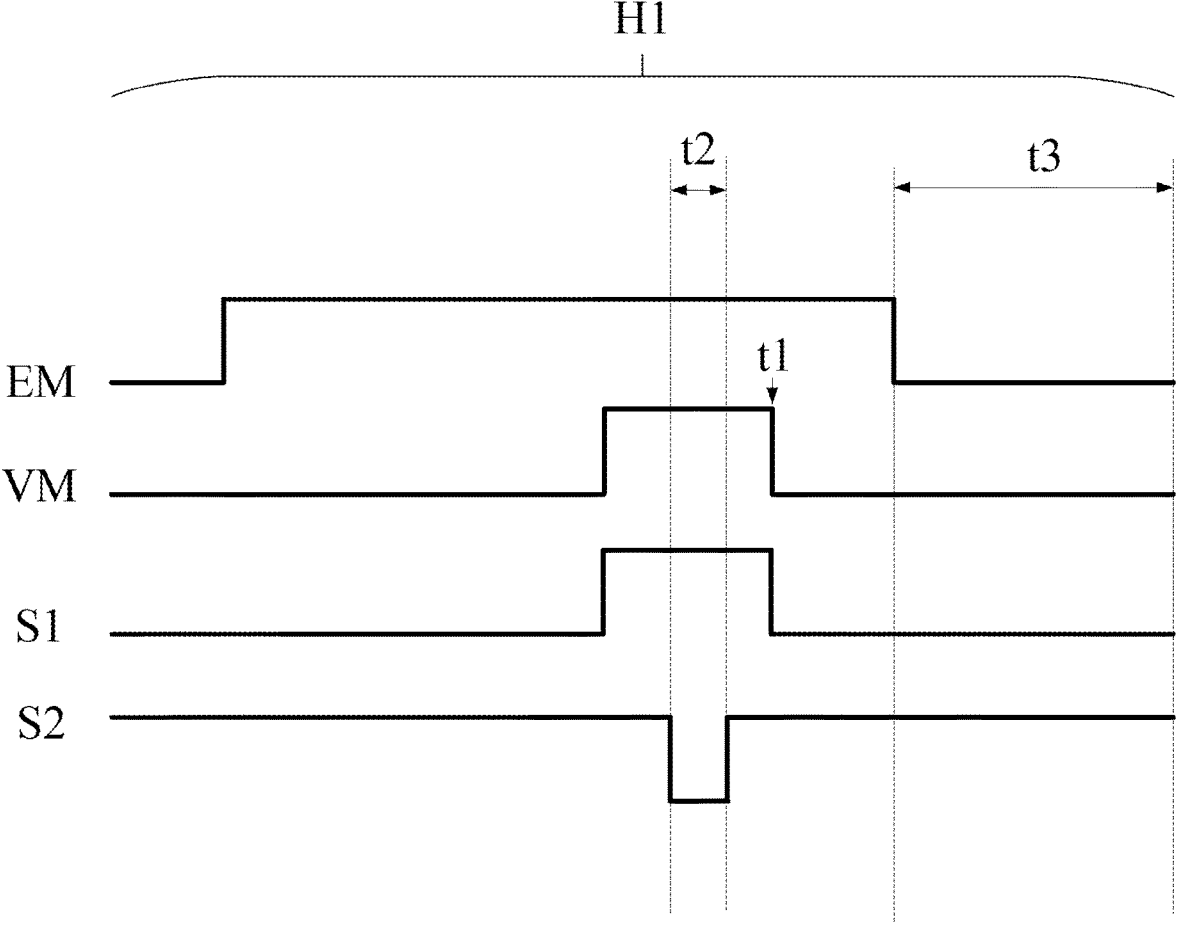
FIG. 6 is a drive timing diagram of a pixel circuit in a display panel according to an embodiment of the present application.

FIG. 6 is a drive timing diagram of a pixel circuit in a display panel according to an embodiment of the present application. As shown in FIG. 6, according to some embodiments of the present application, optionally, in conjunction with FIGS. 2 and 6, one image refresh period H of the pixel circuit 100 may further include a data write stage t2 and a light emission stage t3. In the data write stage t2, a data signal may be written to the first node N1. In the light emission stage t3, the pixel circuit 100 may drive the light-emitting element D to emit light.

The coupling stage t1 may be located after the data write stage t2 and before the light emission stage t3.

In this manner, after the data write stage t2 and before the light emission stage t3, the potential of the first node N1 is adjusted through the coupling of the coupling device 102. In this manner, in the light emission stage t3, the drive circuit 101 may output a relatively large drive current based on the adjusted potential of the first node N1, and the brightness of the light-emitting element D is increased, so that the brightness of the light-emitting element D reaches or approaches the expected target brightness.

Figure 7:
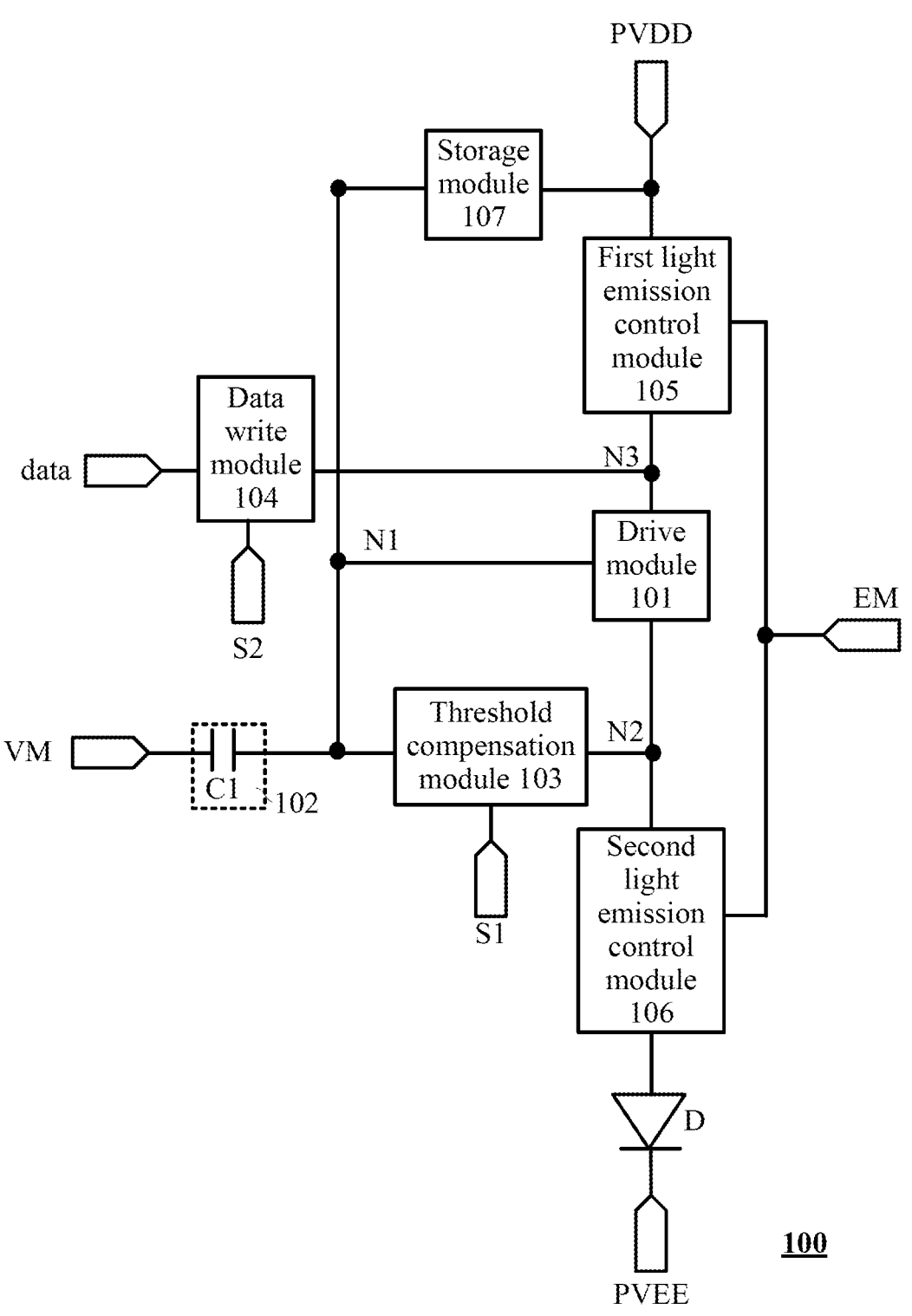
FIG. 7 is a circuit diagram of a pixel circuit in a display panel according to an embodiment of the present application.

FIG. 7 is a circuit diagram of a pixel circuit in a display panel according to an embodiment of the present application. As shown in FIG. 7, according to some embodiments of the present application, optionally, the pixel circuit 100 may include a drive circuit 101, a coupling device 102, a threshold compensation device 103, a data write device 104, a first light emission control device 105, a second light emission control device 106 and a storage device 107.

A control terminal of the drive circuit 101 is electrically connected to a first node N1, a first terminal of the drive circuit 101 is electrically connected to a second node N2, and a second terminal of the drive circuit 101 is electrically connected to a third node N3.

A first terminal of the coupling device 102 may be electrically connected to a target voltage signal line VM, and a second terminal of the coupling device 102 may be electrically connected to the first node N1.

A control terminal of the threshold compensation device 103 is electrically connected to a first scan signal line S1, a first terminal of the threshold compensation device 103 is electrically connected to the first node N1, and a second terminal of the threshold compensation device 103 is electrically connected to the second node N2. The threshold compensation device 103 may be configured to be turned on under control of the first scan signal line S1 and connect the first node N1 to the second node N2, thereby compensating a threshold voltage Vth of the drive circuit 101.

A control terminal of the data write device 104 is electrically connected to a second scan signal line S2, a first terminal of the data write device 104 is electrically connected to a data signal line data, and a second terminal of the data write device 104 is electrically connected to the first node N1. The data write device 104 may be configured to be turned on under control of the second scan signal line S2 and write a data signal of the data signal line data to the first node N1.

A control terminal of the first light emission control device 105 is electrically connected to a light emission control signal EM, a first terminal of the first light emission control device 105 is electrically connected to a first power voltage signal line PVDD, and a second terminal of the first light emission control device 105 is electrically connected to the third node N3.

A control terminal of the second light emission control device 106 is electrically connected to the light emission control signal EM, a first terminal of the second light emission control device 106 is electrically connected to the second node N2, and a second terminal of the second light emission control device 106 is electrically connected to a first electrode of a light-emitting element D. For example, the first electrode of the light-emitting element D may be an anode of the light-emitting element D, and a second electrode of the light-emitting element D may be a cathode of the light-emitting element D.

A first plate of the storage device 107 is electrically connected to the first power voltage signal line PVDD, and a second plate of the storage device 107 is electrically connected to the first node N1.

In FIG. 6, the case where on levels of the data write device 104, the first light emission control device 105 and the second light emission control device 106 are low levels is used as an example for illustration. For ease of understanding, in conjunction with FIGS. 6 and 7, in the data write stage t2, the threshold compensation device 103 may be turned on under the control of the first scan signal line S1, the data write device 104 may be turned on under the control of the second scan signal line S2, the data signal of the data signal line data is written to the first node N1 via the data write device 104, the drive circuit 101 and the threshold compensation device 103 in sequence, and the threshold voltage Vth of the drive circuit 101 is compensated. In this case, it is assumed that the potential of the first node N1 is Vdata–Vth. Vdata denotes a data voltage, that is, a voltage of the data signal, and Vth denotes the threshold voltage Vth of the drive circuit 101.

The case where the drive circuit 101 is the p-type transistor is used as an example. In the coupling stage t1, the potential of the target voltage signal line VM may be switched from a high level to a low level, and the coupling device 102 may pull down the potential of the first node N1 in response to the potential variation of the target voltage signal line VM. The potential of the first node N1 is pulled down to Vdata–Vth–ΔV.

In the light emission stage t3, the first light emission control device 105 and the second light emission control device 106 are turned on under control of the light emission control signal EM, and the drive circuit 101 may output the drive current based on the potential of the first node N1 that is pulled down to Vdata–Vth–ΔV.

Compared with the potential Vdata–Vth of the first node N1 that is not pulled down, the potential Vdata–Vth–ΔV of the first node N1 that is pulled down is lower. Therefore, the drive circuit 101 may output a larger drive current, and the brightness of the light-emitting element D is increased, so that the brightness of the light-emitting element D reaches or approaches the expected target brightness.

As shown in FIG. 7, according to some embodiments of the present application, optionally, the coupling device 102 may include a coupling capacitance C1, where a first plate of the coupling capacitance C1 may be electrically connected to the target voltage signal line VM, and a second plate of the coupling capacitance C1 may be electrically connected to the first node N1.

In conjunction with FIGS. 2 and 7, a capacitance value of a coupling capacitance C1 in the first pixel circuit 100a may be different from a capacitance value of a coupling capacitance C1 in the second pixel circuit 100b.

In this manner, on the one hand, the potential of the control terminal (i.e., the first node) of the drive circuit may be adjusted through coupling of the coupling capacitance C1, which is conducive to adjusting the drive current output by the drive circuit, so that the brightness of the light-emitting element reaches or approaches the expected target brightness. On the other hand, for the first color light-emitting element and the second color light-emitting element of different colors, the capacitance value of the coupling capacitance C1 in the first pixel circuit and the capacitance value of the coupling capacitance C1 in the second pixel circuit are differently designed, and the potential of the first node in the first pixel circuit and the potential of the first node in the second pixel circuit may be differently adjusted, so that the drive current output by the drive circuit in the first pixel circuit and the drive current output by the drive circuit in the second pixel circuit can reach the target drive currents of the respective expected current values and the first color light-emitting element and the second color light-emitting element can reach or approach the respective expected target brightness, thereby improving the problem of color cast and improving the display effect of the display panel. On the other hand, in the case where the drive current output by the drive circuit is adjusted through the coupling of the coupling capacitance C1, it is conducive to dropping a voltage value of a first power voltage signal (a positive power voltage signal) of the first power voltage signal line PVDD provided to the pixel circuit, thereby reducing the power consumption.

As shown in FIG. 2, according to some embodiments of the present application, optionally, luminescence efficiency of the first color light-emitting element D1 is less than luminescence efficiency of the second color light-emitting element D2. Correspondingly, the capacitance value of the coupling device 102 in the first pixel circuit 100a is greater than the capacitance value of the coupling device 102 in the second pixel circuit 100b. For example, as shown in FIG. 7, in some specific examples, the capacitance value of the coupling capacitance C1 in the first pixel circuit 100a may be greater than the capacitance value of the coupling capacitance C1 in the second pixel circuit 100b.

In this manner, since the capacitance value of the coupling device 102 in the first pixel circuit 100a is greater than the capacitance value of the coupling device 102 in the second pixel circuit 100b, the voltage adjustment amount of the coupling device 102 in the first pixel circuit 100a for the potential of the first node N1 in the first pixel circuit 100a is greater than the voltage adjustment amount of the coupling device 102 in the second pixel circuit 100b for the potential of the first node N1 in the second pixel circuit 100b so that the potential of the first node N1 in the first pixel circuit 100a is lower than the potential of the first node N1 in the second pixel circuit 100b, the drive current output by the drive circuit 101 in the first pixel circuit 100a is increased to a greater extent and brightness of the first color light-emitting element D1 with relatively low luminescence efficiency is increased to a greater extent, thereby improving the problem of color cast and improving the display effect of the display panel.

In some specific examples, for example, the first color light-emitting element D1 may include a blue light-emitting element, and the second color light-emitting element D2 may include a green light-emitting element or a red light-emitting element.

In some other specific examples, for example, the first color light-emitting element D1 may include a red light-emitting element, and the second color light-emitting element D2 may include a green light-emitting element.

Figure 8:
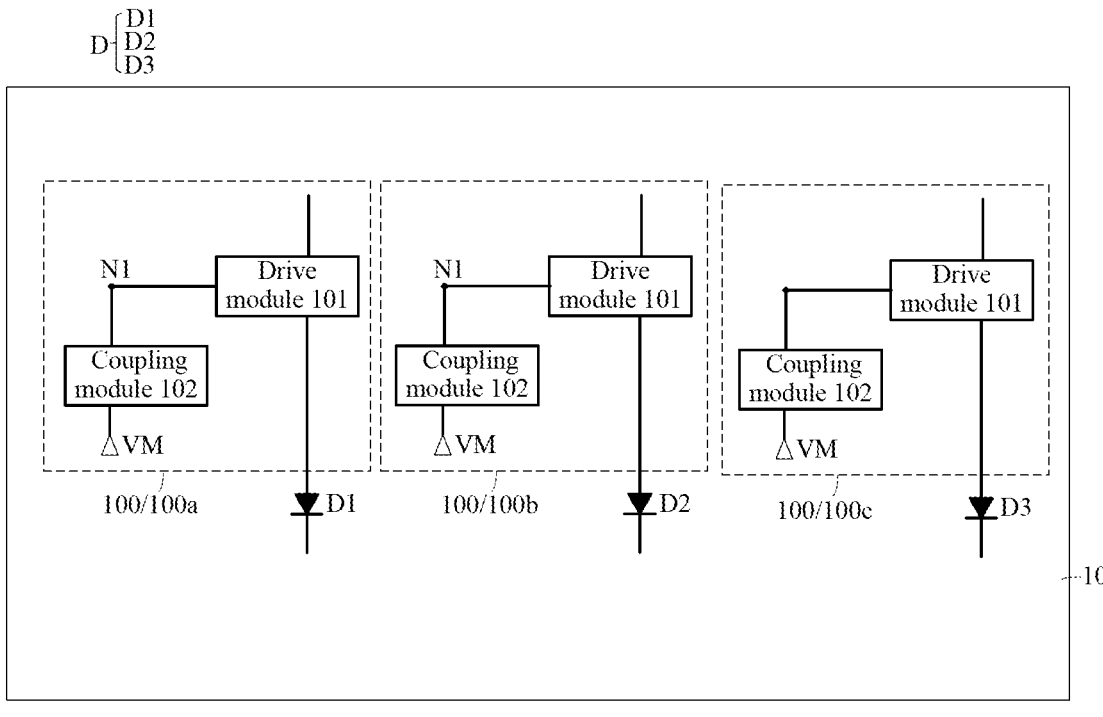
FIG. 8 is another partial circuit diagram of a display panel according to an embodiment of the present application.

FIG. 8 is another partial circuit diagram of a display panel according to an embodiment of the present application. As shown in FIG. 8, according to some embodiments of the present application, optionally, the light-emitting element D may further include a third color light-emitting element D3. The pixel circuit 100 may further include a third pixel circuit 100c, where the third pixel circuit 100c may be electrically connected to the third color light-emitting element D3. The third pixel circuit 100c may be configured to drive the third color light-emitting element D3 to emit light. The first color light-emitting element D1, the second color light-emitting element D2 and the third color light-emitting element D3 may be any two light-emitting elements D of different emitted colors. The type of the transistor of the drive circuit 101 in the first pixel circuit 100a, the type of the transistor of the drive circuit 101 in the second pixel circuit 100b and a type of a transistor of a drive circuit 101 in the third pixel circuit 100c may be the same. That is, in some examples, the drive circuit 101 in the first pixel circuit 100a, the drive circuit 101 in the second pixel circuit 100b and the drive circuit 101 in the third pixel circuit 100c may all be p-type transistors. In some other examples, the drive circuit 101 in the first pixel circuit 100a, the drive circuit 101 in the second pixel circuit 100b and the drive circuit 101 in the third pixel circuit 100c may all be n-type transistors.

At least one of the capacitance value of the coupling device 102 in the first pixel circuit 100a and the capacitance value of the coupling device 102 in the second pixel circuit 100b may be different from a capacitance value of a coupling device 102 in the third pixel circuit 100c.

For example, in some examples, the capacitance value of the coupling device 102 in the third pixel circuit 100c may be the same as the capacitance value of the coupling device 102 in the first pixel circuit 100a and may be different from the capacitance value of the coupling device 102 in the second pixel circuit 100b.

For example, in some other examples, the capacitance value of the coupling device 102 in the third pixel circuit 100c may be the same as the capacitance value of the coupling device 102 in the second pixel circuit 100b and may be different from the capacitance value of the coupling device 102 in the first pixel circuit 100a.

For example, in some other examples, the capacitance value of the coupling device 102 in the third pixel circuit 100c may be different from the capacitance value of the coupling device 102 in the first pixel circuit 100a and may be different from the capacitance value of the coupling device 102 in the second pixel circuit 100b.

In this manner, for light-emitting elements of at least two different colors in the display panel, a capacitance value of the coupling device in the pixel circuit is differently designed, and potentials of first nodes in pixel circuits that are respectively connected to the light-emitting elements of the at least two different colors are differently adjusted, so that drive currents output by drive circuits in the pixel circuits that are respectively connected to the light-emitting elements of the at least two different colors can reach target drive currents of respective expected current values and the light-emitting elements of the at least two different colors in the display panel can reach or approach respective expected target brightness, thereby improving the problem of color cast and improving the display effect of the display panel.

According to some embodiments of the present application, optionally, luminescence efficiency of the first color light-emitting element D1 may be less than luminescence efficiency of the third color light-emitting element D3, and the luminescence efficiency of the third color light-emitting element D3 may be less than luminescence efficiency of the second color light-emitting element D2.

The capacitance value of the coupling device 102 in the first pixel circuit 100a is not less than the capacitance value of the coupling device 102 in the third pixel circuit 100c, and the capacitance value of the coupling device 102 in the third pixel circuit 100c is not less than the capacitance value of the coupling device 102 in the second pixel circuit 100b.

For example, in some examples, the capacitance value of the coupling device 102 in the first pixel circuit 100a may be greater than or equal to the capacitance value of the coupling device 102 in the third pixel circuit 100c, and the capacitance value of the coupling device 102 in the third pixel circuit 100c may be greater than the capacitance value of the coupling device 102 in the second pixel circuit 100b.

In this manner, for the first color light-emitting element D1, the second color light-emitting element D2 and the third color light-emitting element D3 with different luminescence efficiency, since the capacitance value of the coupling device 102 in the first pixel circuit 100a is greater than or equal to the capacitance value of the coupling device 102 in the third pixel circuit 100c and the capacitance value of the coupling device 102 in the third pixel circuit 100c is greater than the capacitance value of the coupling device 102 in the second pixel circuit 100b, the voltage adjustment amount of the coupling device 102 in the first pixel circuit 100a for the potential of the first node N1 in the first pixel circuit 100a is not less than a voltage adjustment amount of the coupling device 102 in the third pixel circuit 100c for a potential of a first node N1 in the third pixel circuit 100c, and the voltage adjustment amount of the coupling device 102 in the third pixel circuit 100c for the potential of the first node N1 in the third pixel circuit 100c is larger than the voltage adjustment amount of the coupling device 102 in the second pixel circuit 100b for the potential of the first node N1 in the second pixel circuit 100b so that the potential of the first node N1 in the first pixel circuit 100a is not larger than the potential of the first node N1 in the third pixel circuit 100c, and the potential of the first node N1 in the third pixel circuit 100c is less than the potential of the first node N1 in the second pixel circuit 100b, drive currents output by drive circuits 101 in the first pixel circuit 100a and the third pixel circuit 100c are increased and brightness of the first color light-emitting element D1 and the third color light-emitting element D3 with relatively low luminescence efficiency is increased, thereby improving the problem of color cast and improving the display effect of the display panel.

For example, in some other examples, the capacitance value of the coupling device 102 in the first pixel circuit 100a may be greater than the capacitance value of the coupling device 102 in the third pixel circuit 100c, and the capacitance value of the coupling device 102 in the third pixel circuit 100c may be greater than the capacitance value of the coupling device 102 in the second pixel circuit 100b.

In this manner, for the first color light-emitting element D1, the second color light-emitting element D2 and the third color light-emitting element D3 with different luminescence efficiency, since the capacitance value of the coupling device 102 in the first pixel circuit 100a is greater than the capacitance value of the coupling device 102 in the third pixel circuit 100c and the capacitance value of the coupling device 102 in the third pixel circuit 100c is greater than the capacitance value of the coupling device 102 in the second pixel circuit 100b, the voltage adjustment amount of the coupling device 102 in the first pixel circuit 100a for the potential of the first node N1 in the first pixel circuit 100a is larger than the voltage adjustment amount of the coupling device 102 in the third pixel circuit 100c for the potential of the first node N1 in the third pixel circuit 100c, and the voltage adjustment amount of the coupling device 102 in the third pixel circuit 100c for the potential of the first node N1 in the third pixel circuit 100c is larger than the voltage adjustment amount of the coupling device 102 in the second pixel circuit 100b for the potential of the first node N1 in the second pixel circuit 100b so that the potential of the first node N1 in the first pixel circuit 100a is less than the potential of the first node N1 in the third pixel circuit 100c, and the potential of the first node N1 in the third pixel circuit 100c is less than the potential of the first node N1 in the second pixel circuit 100b, the drive current output by the drive circuit 101 in the first pixel circuit 100a is increased to a greater extent, a drive current output by the drive circuit 101 in the third pixel circuit 100c is increased to a certain extent, the brightness of the first color light-emitting element D1 with the lowest luminescence efficiency is increased to a greater extent, and brightness of the third color light-emitting element D3 with relatively low luminescence efficiency is increased to a certain extent, thereby improving the problem of color cast and improving the display effect of the display panel.

For example, in some other examples, the capacitance value of the coupling device 102 in the first pixel circuit 100a may be greater than the capacitance value of the coupling device 102 in the third pixel circuit 100c, and the capacitance value of the coupling device 102 in the third pixel circuit 100c may be equal to the capacitance value of the coupling device 102 in the second pixel circuit 100b.

In this manner, for the first color light-emitting element D1, the second color light-emitting element D2 and the third color light-emitting element D3 with different luminescence efficiency, since the capacitance value of the coupling device 102 in the first pixel circuit 100a is greater than the capacitance value of the coupling device 102 in the third pixel circuit 100c and the capacitance value of the coupling device 102 in the third pixel circuit 100c is equal to the capacitance value of the coupling device 102 in the second pixel circuit 100b, the voltage adjustment amount of the coupling device 102 in the first pixel circuit 100a for the potential of the first node N1 in the first pixel circuit 100a is larger than the voltage adjustment amount of the coupling device 102 in the third pixel circuit 100c for the potential of the first node N1 in the third pixel circuit 100c and the voltage adjustment amount of the coupling device 102 in the third pixel circuit 100c for the potential of the first node N1 in the third pixel circuit 100c is equal to the voltage adjustment amount of the coupling device 102 in the second pixel circuit 100b for the potential of the first node N1 in the second pixel circuit 100b so that the potential of the first node N1 in the first pixel circuit 100a is less than the potential of the first node N1 in the third pixel circuit 100c and the potential of the first node N1 in the third pixel circuit 100c is equal to the potential of the first node N1 in the second pixel circuit 100b, the drive current output by the drive circuit 101 in the first pixel circuit 100a is increased to a greater extent and the brightness of the first color light-emitting element D1 with the lowest luminescence efficiency is increased to a greater extent, thereby improving the problem of color cast and improving the display effect of the display panel.

In some specific examples, optionally, the first color light-emitting element D1 may include a blue light-emitting element, the second color light-emitting element D2 may include a green light-emitting element, and the third color light-emitting element D3 may include a red light-emitting element.

Figure 9:
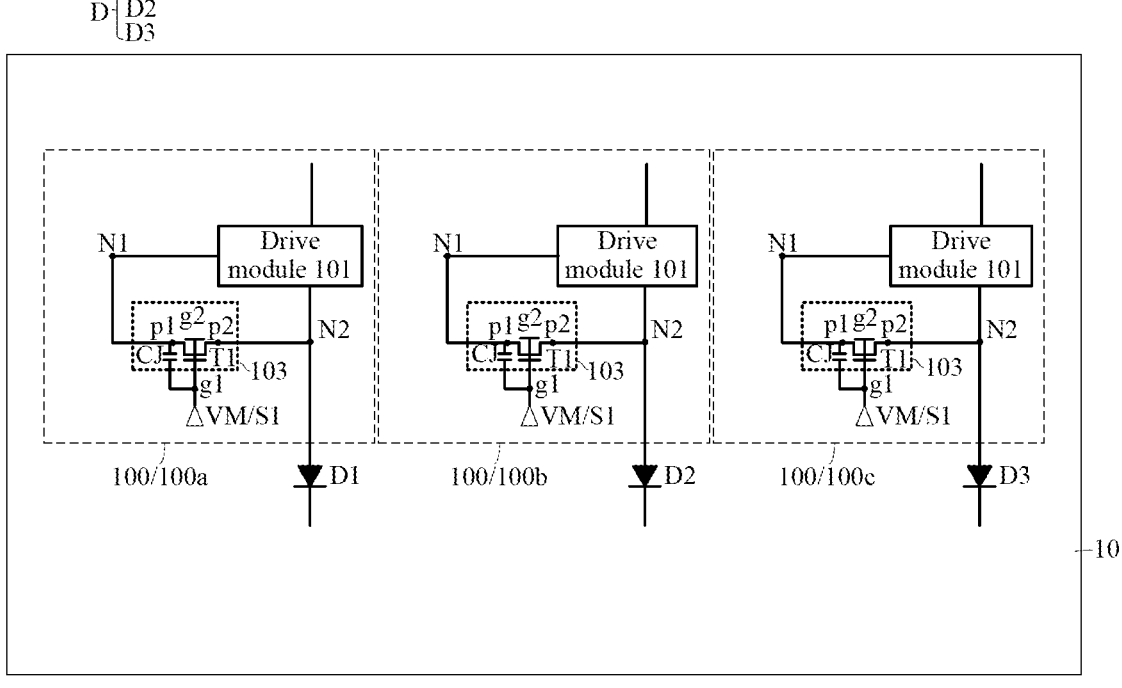
FIG. 9 is another partial circuit diagram of a display panel according to an embodiment of the present application.

FIG. 9 is another partial circuit diagram of a display panel according to an embodiment of the present application. As shown in FIG. 9, according to some embodiments of the present application, optionally, the pixel circuit 100 may further include a threshold compensation device 103, where a control terminal of the threshold compensation device 103 may be electrically connected to a first scan signal line S1, a first terminal of the threshold compensation device 103 may be electrically connected to the first node N1, and a second terminal of the threshold compensation device 103 may be electrically connected to a first terminal (i.e., a second node N2) of the drive circuit 101.

The coupling device 102 may include a parasitic capacitance CJ of the threshold compensation device 103, and the target voltage signal line VM may include the first scan signal line S1.

In this manner, the parasitic capacitance of the threshold compensation device also serves as the coupling device so that no additional coupling device needs to be separately disposed and the number of electronic devices in the pixel circuit can be reduced, which is conducive to simplifying a wiring design, saving a wiring space and reducing a cost.

It is to be noted that a type of a transistor of a threshold compensation device 103 in the first pixel circuit 100a may be the same as a type of a transistor of a threshold compensation device 103 in the second pixel circuit 100b. For example, in some examples, the threshold compensation device 103 in the first pixel circuit 100a and the threshold compensation device 103 in the second pixel circuit 100b may both include n-type transistors. In some other examples, the threshold compensation device 103 in the first pixel circuit 100a and the threshold compensation device 103 in the second pixel circuit 100b may both include p-type transistors.

Figure 10:
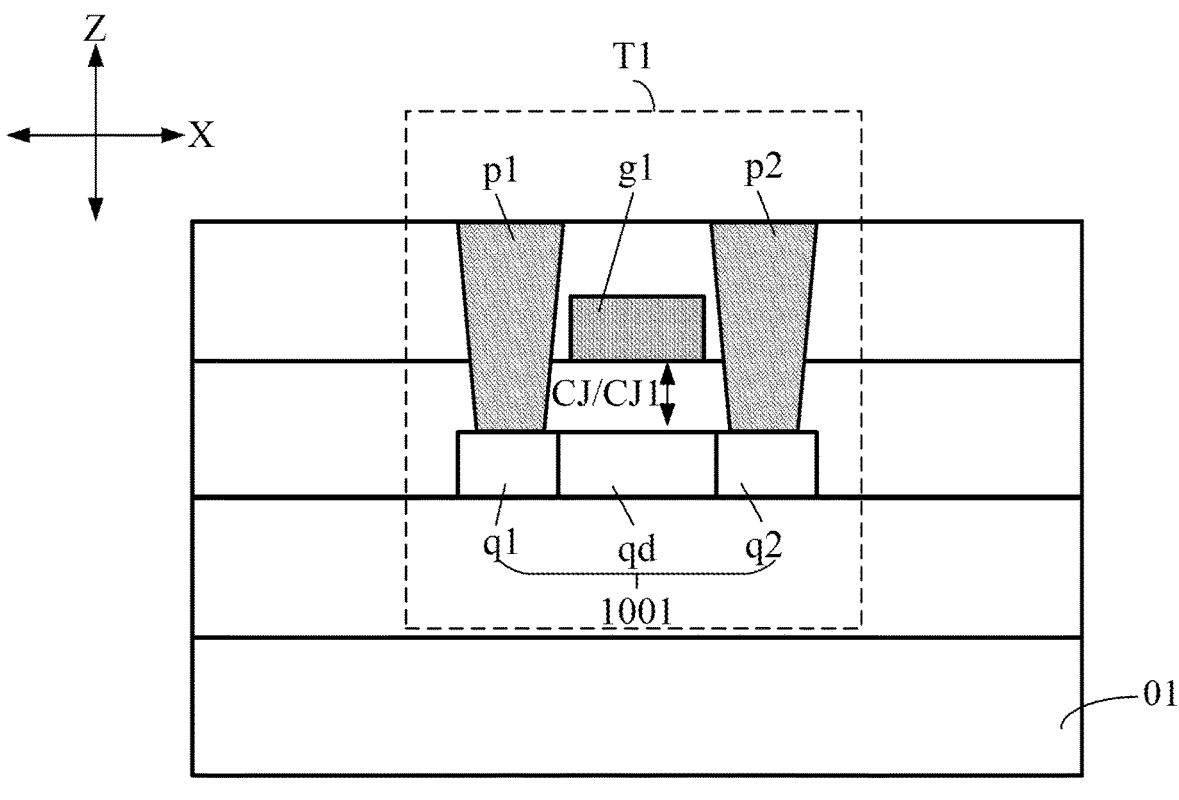
FIG. 10 is a sectional view of a threshold compensation device in a display panel according to an embodiment of the present application.

FIG. 10 is a sectional view of a threshold compensation device in a display panel according to an embodiment of the present application. In conjunction with FIGS. 9 and 10, according to some embodiments of the present application, optionally, the threshold compensation device 103 may include a first transistor T1, where the first transistor T1 may include a first gate g1, a first electrode p1, a second electrode p2 and an active layer 1001. The first electrode p1 of the first transistor T1 and the second electrode p2 of the first transistor T1 may be separately electrically connected to the active layer 1001. For example, among the first electrode p1 of the first transistor T1 and the second electrode p2 of the first transistor T1, one is a source of the first transistor T1, and the other is a drain of the first transistor T1. It is to be noted that for the sake of simplicity of illustration, only some films of the display panel are illustrated in FIG. 10.

The first gate g1 of the first transistor T1 may be electrically connected to the first scan signal line S1, and the first electrode p1 of the first transistor T1 may be electrically connected to the first node N1. It is to be noted that in some optional embodiments, the first electrode p1 and the second electrode p2 may be integrally formed on the active layer 1001, which is not limited in the present application.

The parasitic capacitance CJ may include a first parasitic capacitance CJ1 between the first gate g1 and the active layer 1001 of the first transistor T1.

In this manner, the first parasitic capacitance CJ1 between the first gate g1 and the active layer 1001 of the first transistor T1 also serves as the coupling device (or the coupling capacitance) so that no additional coupling device needs to be separately disposed and the number of electronic devices in the pixel circuit can be reduced, which is conducive to simplifying the wiring design, saving the wiring space and reducing the cost.

When the first transistor T1 is a single-gate transistor (that is, the first transistor T1 includes only the first gate g1), the parasitic capacitance CJ may be the first parasitic capacitance CJ1. For example, a capacitance value of the parasitic capacitance CJ may be calculated by using the following expression (3):

$$\frac{CJ'(vgh - vgl)}{c\_N1\_total} = V1 \tag{3}$$

$$CJ' = CJ1' = V1 * \frac{c\_N1\_total}{vgh - vgl} \approx V1 * \frac{cst'}{vgh - vgl}$$

where CJ' denotes the capacitance value of the parasitic capacitance CJ, CJ1' denotes a capacitance value of the first parasitic capacitance CJ1, V1 denotes a voltage value of the first node N1 obtained after coupling of the parasitic capacitance CJ, c_N1_total denotes a capacitance value of a total capacitance corresponding to the first node N1, and cst' denotes a capacitance value of a storage capacitor Cst connected to the first node N1; c_N1_total=cst'+CJ'+Δc, where Δc denotes some other parasitic capacitances that may exist at the first node N1, c_N1_total is mainly the capacitance value of the storage capacitor Cst due to relatively small CJ' and Δc, and thus c_N1_total≈cst'; vgh denotes a voltage value obtained when the first scan signal line S1 outputs a high level, and vgl denotes a voltage value obtained when the first scan signal line S1 outputs a low level.

As shown in FIG. 10, in some examples, in a thickness direction Z of the display panel, the first gate g1 of the first transistor T1 may be located on a side of the active layer 1001 facing away from a substrate 01 of the display panel, that is, the first gate g1 of the first transistor T1 may be a top gate. In other embodiments, in the thickness direction Z of the display panel, the first gate g1 of the first transistor T1 may also be located on a side of the active layer 1001 close to the substrate 01 of the display panel, that is, the first gate g1 of the first transistor T1 may also be a bottom gate, which is not limited in the present application.

Figure 11:
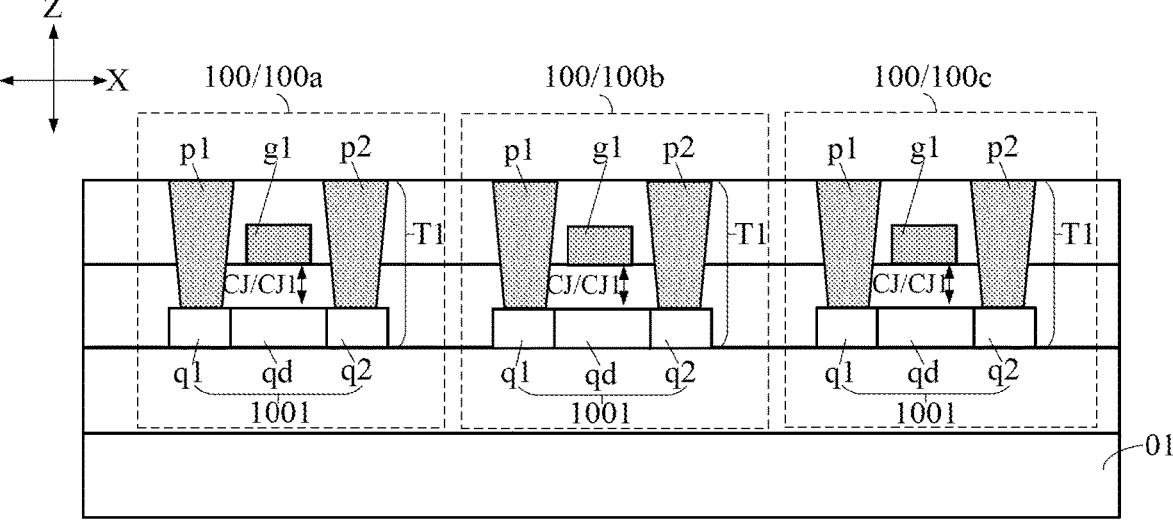
FIG. 11 is another sectional view of a threshold compensation device in a display panel according to an embodiment of the present application.

FIG. 11 is another sectional view of a threshold compensation device in a display panel according to an embodiment of the present application. As shown in FIG. 11, according to some embodiments of the present application, optionally, the active layer 1001 may include a first region q1, a channel region qd and a second region q2 that are arranged in a first direction X. The first region q1 is electrically connected to the first electrode p1 of the first transistor T1, and the second region q2 is electrically connected to the second electrode p2 of the first transistor T1.

Figure 12:
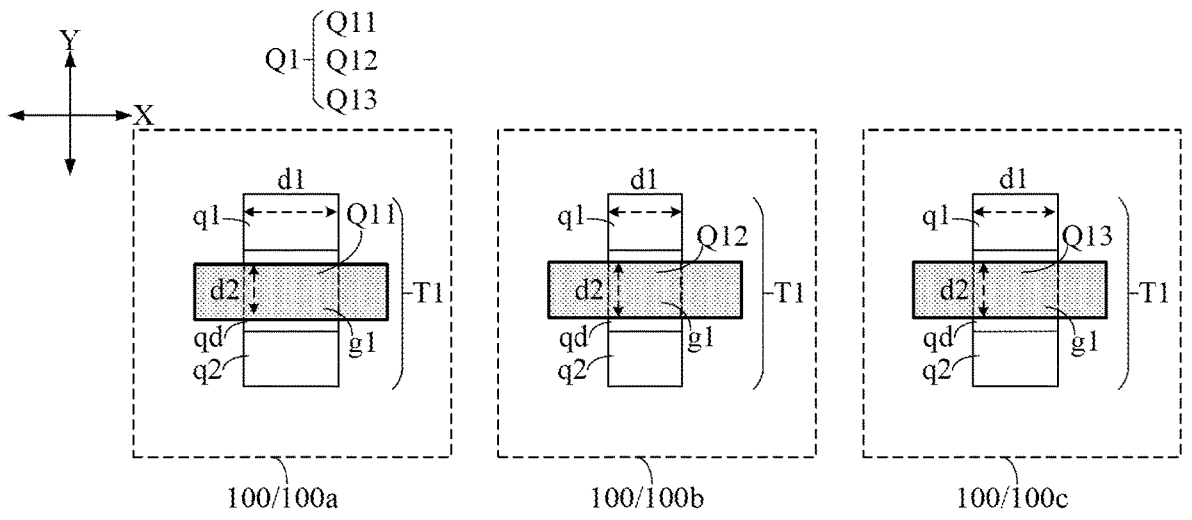
FIG. 12 is a partial top view of a threshold compensation device in a display panel according to an embodiment of the present application.

FIG. 12 is a partial top view of a threshold compensation device in a display panel according to an embodiment of the present application. In conjunction with FIGS. 11 and 12, in a thickness direction Z of the display panel, an overlapping area between the first gate g1 of the first transistor T1 and the channel region qd may be a first overlapping area Q1.

For ease of description, a first overlapping area of a first transistor T1 in the first pixel circuit 100a is represented by Q11, and a first overlapping area of a first transistor T1 in the second pixel circuit 100b is represented by Q12.

The first overlapping area Q11 of the first transistor T1 in the first pixel circuit 100a may be different from the first overlapping area Q12 of the first transistor T1 in the second pixel circuit 100b.

In this manner, since the first overlapping area Q11 of the first transistor T1 in the first pixel circuit 100a is different from the first overlapping area Q12 of the first transistor T1 in the second pixel circuit 100b, a capacitance value of a first parasitic capacitance CJ1 in the first pixel circuit 100a is different from a capacitance value of a first parasitic capacitance CJ1 in the second pixel circuit 100b. The capacitance value of the first parasitic capacitance CJ1 in the first pixel circuit and the capacitance value of the first parasitic capacitance CJ1 in the second pixel circuit are differently designed, and the potential of the first node in the first pixel circuit and the potential of the first node in the second pixel circuit may be differently adjusted, so that the drive current output by the drive circuit in the first pixel circuit and the drive current output by the drive circuit in the second pixel circuit can reach the target drive currents of the respective expected current values and the first color light-emitting element and the second color light-emitting element can reach or approach the respective expected target brightness, thereby improving the problem of color cast and improving the display effect of the display panel.

According to some embodiments of the present application, optionally, the luminescence efficiency of the first color light-emitting element may be less than the luminescence efficiency of the second color light-emitting element, and the first overlapping area Q11 of the first transistor T1 in the first pixel circuit 100a may be greater than the first overlapping area Q12 of the first transistor T1 in the second pixel circuit 100b. In this manner, the capacitance value of the first parasitic capacitance CJ1 in the first pixel circuit 100a may be greater than the capacitance value of the first parasitic capacitance CJ1 in the second pixel circuit 100b so that the drive current output by the drive circuit in the first pixel circuit is increased to a greater extent and the brightness of the first color light-emitting element with the relatively low luminescence efficiency is increased to a greater extent, thereby improving the problem of color cast and improving the display effect of the display panel.

As shown in FIG. 12, in some embodiments, the display panel may include a third pixel circuit 100c. For case of description, a first overlapping area of a first transistor T1 in the third pixel circuit 100c is represented by Q13. The first overlapping area Q13 of the first transistor T1 in the third pixel circuit 100c may be different from at least one of the first overlapping area Q11 of the first transistor T1 in the first pixel circuit 100a and the first overlapping area Q12 of the first transistor T1 in the second pixel circuit 100b.

For example, in conjunction with FIGS. 8 and 12, in some specific examples, the luminescence efficiency of the first color light-emitting element D1 may be less than the luminescence efficiency of the third color light-emitting element D3, and the luminescence efficiency of the third color light-emitting element D3 may be less than the luminescence efficiency of the second color light-emitting element D2.

Correspondingly, the first overlapping area Q11 of the first transistor T1 in the first pixel circuit 100a is not less than the first overlapping area Q13 of the first transistor T1 in the third pixel circuit 100c and the first overlapping area Q13 of the first transistor T1 in the third pixel circuit 100c is not less than the first overlapping area Q12 of the first transistor T1 in the second pixel circuit 100b. In this manner, the capacitance value of the first parasitic capacitance CJ1 in the first pixel circuit 100a is not less than a capacitance value of a first parasitic capacitance CJ1 in the third pixel circuit 100c and the capacitance value of the first parasitic capacitance CJ1 in the third pixel circuit 100c is not less than the capacitance value of the first parasitic capacitance CJ1 in the second pixel circuit 100b.

As shown in FIG. 12, according to some embodiments of the present application, optionally, a distance of the channel region qd in the first direction X is a first distance d1, a distance of the first gate g1 of the first transistor T1 in a second direction Y is a second distance d2, and the second direction Y intersects the first direction X.

A first distance d1 of the first transistor T1 in the first pixel circuit 100a may be greater than a first distance d1 of the first transistor T1 in the second pixel circuit 100b, and/or a second distance d2 of the first transistor T1 in the first pixel circuit 100a may be greater than a second distance d2 of the first transistor T1 in the second pixel circuit 100b.

In this manner, the first overlapping area Q11 of the first transistor T1 in the first pixel circuit 100a may be greater than the first overlapping area Q12 of the first transistor T1 in the second pixel circuit 100b.

According to some embodiments of the present application, optionally, the display panel may include a third pixel circuit 100c, where at least one of the first distance d1 of the first transistor T1 in the first pixel circuit 100a and the first distance d1 of the first transistor T1 in the second pixel circuit 100b may be different from a first distance d1 of the first transistor T1 in the third pixel circuit 100c, and/or at least one of the second distance d2 of the first transistor T1 in the first pixel circuit 100a and the second distance d2 of the first transistor T1 in the second pixel circuit 100b may be different from a second distance d2 of the first transistor T1 in the third pixel circuit 100c.

For example, in some specific examples, the first distance d1 of the first transistor T1 in the first pixel circuit 100a may be greater than the first distance d1 of the first transistor T1 in the third pixel circuit 100c, the first distance d1 of the first transistor T1 in the third pixel circuit 100c may be greater than the first distance d1 of the first transistor T1 in the second pixel circuit 100b, and/or the second distance d2 of the first transistor T1 in the first pixel circuit 100a may be greater than the second distance d2 of the first transistor T1 in the third pixel circuit 100c, and the second distance d2 of the first transistor T1 in the third pixel circuit 100c may be greater than the second distance d2 of the first transistor T1 in the second pixel circuit 100b.

In this manner, the first overlapping area Q11 of the first transistor T1 in the first pixel circuit 100a may be greater than the first overlapping area Q13 of the first transistor T1 in the third pixel circuit 100c, and the first overlapping area Q13 of the first transistor T1 in the third pixel circuit 100c may be greater than the first overlapping area Q12 of the first transistor T1 in the second pixel circuit 100b.

In FIG. 12, the case where the first distance d1 of the first transistor T1 in the first pixel circuit 100a is greater than the first distance d1 of the first transistor T1 in the third pixel circuit 100c and the first distance d1 of the first transistor T1 in the third pixel circuit 100c is greater than the first distance d1 of the first transistor T1 in the second pixel circuit 100b is used as an example for illustration.

Figure 13:
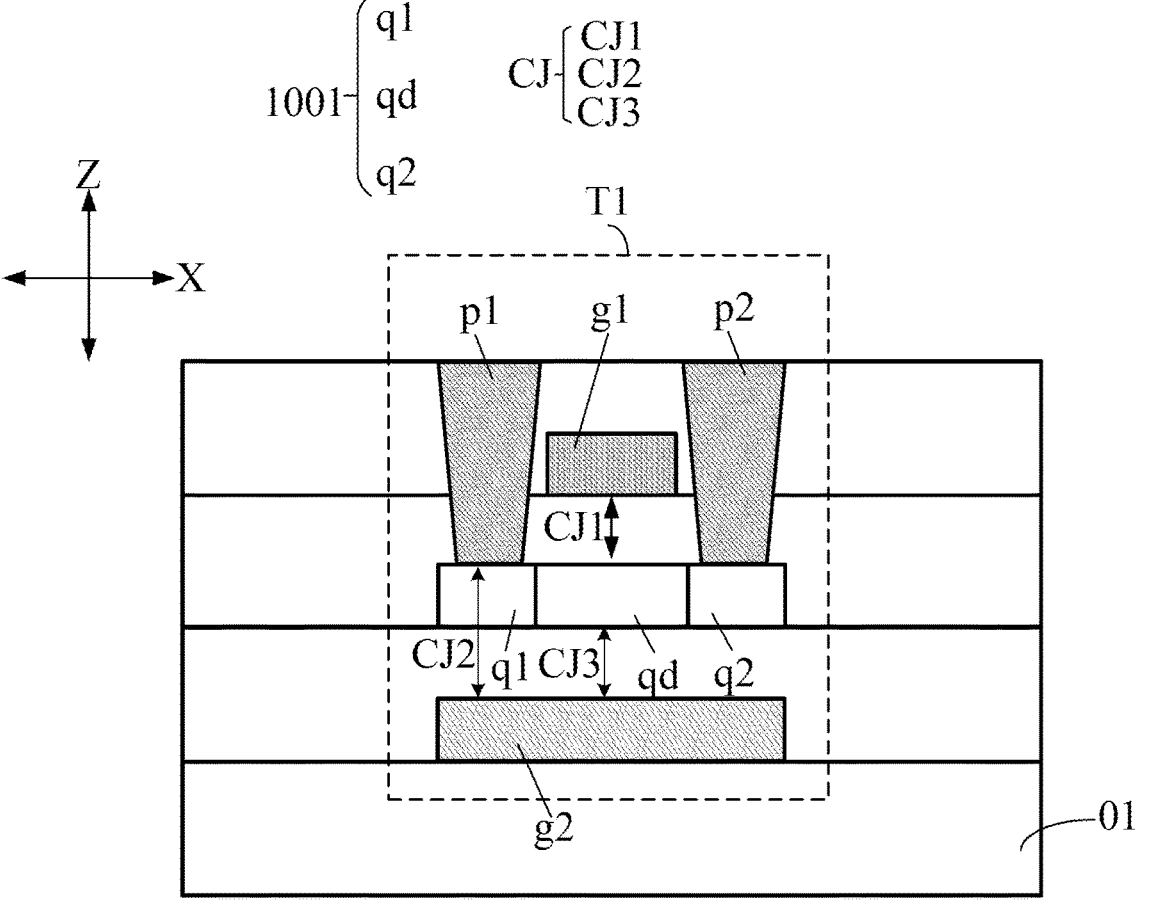
FIG. 13 is another sectional view of a threshold compensation device in a display panel according to an embodiment of the present application.

FIG. 13 is another sectional view of a threshold compensation device in a display panel according to an embodiment of the present application. In conjunction with FIGS. 9 and 13, according to some embodiments of the present application, optionally, the threshold compensation device 103 may include a first transistor T1, where the first transistor T1 may include a first gate g1, a second gate g2, a first electrode p1, a second electrode p2 and an active layer 1001. The first electrode p1 of the first transistor T1 and the second electrode p2 of the first transistor T1 may be separately electrically connected to the active layer 1001. For example, among the first electrode p1 of the first transistor T1 and the second electrode p2 of the first transistor T1, one is a source of the first transistor T1, and the other is a drain of the first transistor T1.

The first gate g1 of the first transistor T1 and the second gate g2 of the first transistor T1 may be separately electrically connected to the first scan signal line S1, and the first electrode p1 of the first transistor T1 may be electrically connected to the first node N1.

The parasitic capacitance CJ may include a first parasitic capacitance CJ1 between the first gate g1 and the active layer 1001 of the first transistor T1, and/or the parasitic capacitance CJ may include a second parasitic capacitance CJ2 between the second gate g2 of the first transistor T1 and the first electrode p1 of the first transistor T1, and/or the parasitic capacitance CJ may include a third parasitic capacitance CJ3 between the second gate g2 and the active layer 1001 of the first transistor T1.

In this manner, the first parasitic capacitance CJ1, the second parasitic capacitance CJ2 and/or the third parasitic capacitance CJ3 also serve as the coupling device (or the coupling capacitance) so that no additional coupling device needs to be separately disposed and the number of electronic devices in the pixel circuit can be reduced, which is conducive to simplifying the wiring design, saving the wiring space and reducing the cost.

When the first transistor T1 is a double-gate transistor (that is, the first transistor T1 includes the first gate g1 and the second gate g2), for example, the parasitic capacitance CJ may include the first parasitic capacitance CJ1, the second parasitic capacitance CJ2 and the third parasitic capacitance CJ3. The first parasitic capacitance CJ1, the second parasitic capacitance CJ2 and the third parasitic capacitance CJ3 may be considered to be connected in parallel.

$$CJ' = CJ1' + CJ2' + CJ3' \qquad (4)$$

$$CJ1' = k1 * W1 * La \qquad (5)$$

$$CJ2' = k2 * W2 * L1 \qquad (6)$$

Figure 14:
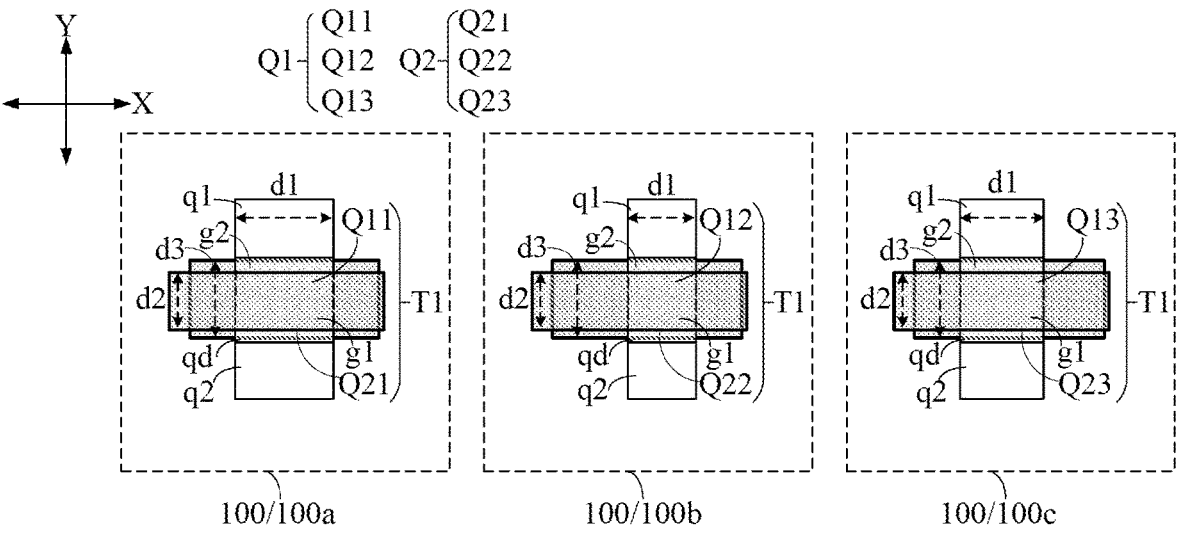
FIG. 14 is another partial top view of a threshold compensation device in a display panel according to an embodiment of the present application.
Figure 15:
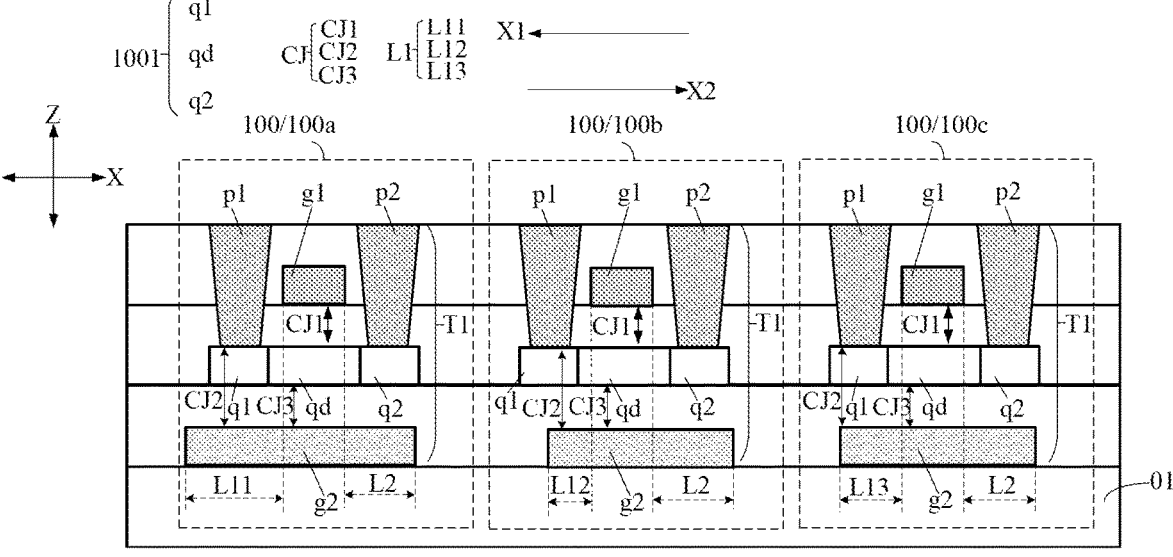
FIG. 15 is another sectional view of a threshold compensation device in a display panel according to an embodiment of the present application.

-continued $$CJ3' = k3 * W1 * Lb \tag{7}$$

where CJ' denotes a capacitance value of the parasitic capacitance CJ, CJ1' denotes a capacitance value of the first parasitic capacitance CJ1, CJ2' denotes a capacitance value of the second parasitic capacitance CJ2, CJ3' denotes a capacitance value of the third parasitic capacitance CJ3, k1, k2 and k3 denote capacitance coefficients per unit area corresponding to different films, respectively, W1 denotes that the distance of the channel region qd in the first direction X shown in FIG. 14 is a first distance d1, La denotes that the distance of the first gate g1 of the first transistor T1 in the second direction Y shown in FIG. 14 is a second distance d2, Lb denotes that the distance of the second gate g2 of the first transistor T1 in the second direction Y shown in FIG. 14 is a third distance d3, W2 denotes a distance of the first electrode p1 of the first transistor T1 in the first direction X, and L1 denotes the first extension amount L1 shown in FIG. 15.

A total capacitance value of the first parasitic capacitance CJ1, the second parasitic capacitance CJ2 and the third parasitic capacitance CJ3 (the capacitance value of the parasitic capacitance CJ) may be calculated, for example, by using the following expression (8):

$$\frac{CJ'(vgh - vgl)}{c\_N1\_total} = V1 \tag{8}$$

$$CJ' = CJ1' + CJ2' + CJ3' = V1 * \frac{c\_N1\_total}{vgh - vgl} \approx V1 * \frac{cst'}{vgh - vgl}$$

where CJ' denotes the capacitance value of the parasitic capacitance CJ, CJ1' denotes the capacitance value of the first parasitic capacitance CJ1, CJ2' denotes the capacitance value of the second parasitic capacitance CJ2, CJ3' denotes the capacitance value of the third parasitic capacitance CJ3, V1 denotes a voltage value of the first node N1 obtained after coupling of the parasitic capacitance CJ, c_N1_total denotes a capacitance value of a total capacitance corresponding to the first node N1, and cst' denotes a capacitance value of a storage capacitor Cst connected to the first node N1; c_N1_total=cst'+CJ'+Δc, where Δc denotes some other parasitic capacitances that may exist at the first node N1, c_N1_total is mainly the capacitance value of the storage capacitor Cst due to relatively small CJ' and Δc, and thus c_N1_total≈cst'; vgh denotes a voltage value obtained when the first scan signal line S1 outputs a high level, and vgl denotes a voltage value obtained when the first scan signal line S1 outputs a low level.

As shown in FIG. 13, in some examples, in a thickness direction Z of the display panel, the first gate g1 of the first transistor T1 may be located on a side of the active layer 1001 facing away from a substrate 01 of the display panel, that is, the first gate g1 of the first transistor T1 may be a top gate. In the thickness direction Z of the display panel, the second gate g2 of the first transistor T1 may be located on a side of the active layer 1001 close to the substrate 01 of the display panel, that is, the second gate g2 of the first transistor T1 may be a bottom gate.

As shown in FIG. 13, according to some embodiments of the present application, optionally, the active layer 1001 may include a first region q1, a channel region qd and a second region q2 that are arranged in a first direction X. The first region q1 is electrically connected to the first electrode p1 of the first transistor T1, and the second region q2 is electrically connected to the second electrode p2 of the first transistor T1.

FIG. 14 is another partial top view of a threshold compensation device in a display panel according to an embodiment of the present application. In conjunction with FIGS. 13 and 14, in a thickness direction Z of the display panel, an overlapping area between the first gate g1 of the first transistor T1 and the channel region qd may be a first overlapping area Q1, and an overlapping area between the second gate g2 of the first transistor T1 and the channel region qd is a second overlapping area Q2.

For ease of description, a first overlapping area of a first transistor T1 in the first pixel circuit 100a is represented by Q11, and a first overlapping area of a first transistor T1 in the second pixel circuit 100b is represented by Q12. A second overlapping area of the first transistor T1 in the first pixel circuit 100a is represented by Q21, and a second overlapping area of the first transistor T1 in the second pixel circuit 100b is represented by Q22.

The first overlapping area Q11 of the first transistor T1 in the first pixel circuit 100a may be different from the first overlapping area Q12 of the first transistor T1 in the second pixel circuit 100b, and/or the second overlapping area Q21 of the first transistor T1 in the first pixel circuit 100a may be different from the second overlapping area Q22 of the first transistor T1 in the second pixel circuit 100b.

In this manner, since the first overlapping area Q11 of the first transistor T1 in the first pixel circuit 100a is different from the first overlapping area Q12 of the first transistor T1 in the second pixel circuit 100b and/or the second overlapping area Q21 of the first transistor T1 in the first pixel circuit 100a is different from the second overlapping area Q22 of the first transistor T1 in the second pixel circuit 100b, a capacitance value of a first parasitic capacitance CJ1 in the first pixel circuit 100a is different from a capacitance value of a first parasitic capacitance CJ1 in the second pixel circuit 100b. The capacitance value of the first parasitic capacitance CJ1 in the first pixel circuit and the capacitance value of the first parasitic capacitance CJ1 in the second pixel circuit are differently designed, and the potential of the first node in the first pixel circuit and the potential of the first node in the second pixel circuit may be differently adjusted, so that the drive current output by the drive circuit in the first pixel circuit and the drive current output by the drive circuit in the second pixel circuit can reach the target drive currents of the respective expected current values and the first color light-emitting element and the second color light-emitting element can reach or approach the respective expected target brightness, thereby improving the problem of color cast and improving the display effect of the display panel.

According to some embodiments of the present application, optionally, the luminescence efficiency of the first color light-emitting element may be less than the luminescence efficiency of the second color light-emitting element, the first overlapping area Q11 of the first transistor T1 in the first pixel circuit 100a may be greater than the first overlapping area Q12 of the first transistor T1 in the second pixel circuit 100b, and/or the second overlapping area Q21 of the first transistor T1 in the first pixel circuit 100a may be greater than the second overlapping area Q22 of the first transistor T1 in the second pixel circuit 100b.

In this manner, the capacitance value of the first parasitic capacitance CJ1 in the first pixel circuit 100a may be greater than the capacitance value of the first parasitic capacitance CJ1 in the second pixel circuit 100b so that the drive current output by the drive circuit in the first pixel circuit is increased to a greater extent and the brightness of the first color light-emitting element with the relatively low luminescence efficiency is increased to a greater extent, thereby improving the problem of color cast and improving the display effect of the display panel.

As shown in FIG. 14, in some embodiments, the display panel may include a third pixel circuit 100c. For ease of description, a first overlapping area of a first transistor T1 in the third pixel circuit 100c is represented by Q13, and a second overlapping area of the first transistor T1 in the third pixel circuit 100c is represented by Q23. The first overlapping area Q13 of the first transistor T1 in the third pixel circuit 100c may be different from at least one of the first overlapping area Q11 of the first transistor T1 in the first pixel circuit 100a and the first overlapping area Q12 of the first transistor T1 in the second pixel circuit 100b, and/or the second overlapping area Q23 of the first transistor T1 in the third pixel circuit 100c may be different from at least one of the second overlapping area Q21 of the first transistor T1 in the first pixel circuit 100a and the second overlapping area Q22 of the first transistor T1 in the second pixel circuit 100b.

For example, in conjunction with FIGS. 8 and 14, in some specific examples, the luminescence efficiency of the first color light-emitting element D1 may be less than the luminescence efficiency of the third color light-emitting element D3, and the luminescence efficiency of the third color light-emitting element D3 may be less than the luminescence efficiency of the second color light-emitting element D2.

Correspondingly, the first overlapping area Q11 of the first transistor T1 in the first pixel circuit 100a is less than the first overlapping area Q13 of the first transistor T1 in the third pixel circuit 100c and the first overlapping area Q13 of the first transistor T1 in the third pixel circuit 100c is not less than the first overlapping area Q12 of the first transistor T1 in the second pixel circuit 100b, and/or the second overlapping area Q21 of the first transistor T1 in the first pixel circuit 100a is less than the second overlapping area Q23 of the first transistor T1 in the third pixel circuit 100c and the second overlapping area Q23 of the first transistor T1 in the third pixel circuit 100c is not less than the second overlapping area Q22 of the first transistor T1 in the second pixel circuit 100b.

In this manner, the capacitance value of the first parasitic capacitance CJ1 in the first pixel circuit 100a is not less than a capacitance value of a first parasitic capacitance CJ1 in the third pixel circuit 100c and the capacitance value of the first parasitic capacitance CJ1 in the third pixel circuit 100c is not less than the capacitance value of the first parasitic capacitance CJ1 in the second pixel circuit 100b.

As shown in FIG. 14, according to some embodiments of the present application, optionally, a distance of the channel region qd in the first direction X is a first distance d1, a distance of the first gate g1 of the first transistor T1 in a second direction Y is a second distance d2, a distance of the second gate g2 of the first transistor T1 in the second direction Y is a third distance d3, and the second direction Y intersects the first direction X.

A first distance d1 of the first transistor T1 in the first pixel circuit 100a may be greater than a first distance d1 of the first transistor T1 in the second pixel circuit 100b, and/or a second distance d2 of the first transistor T1 in the first pixel circuit 100a is greater than a second distance d2 of the first transistor T1 in the second pixel circuit 100b, and/or a third distance d3 of the first transistor T1 in the first pixel circuit 100a is greater than a third distance d3 of the first transistor T1 in the second pixel circuit 100b.

In this manner, the first overlapping area Q11 of the first transistor T1 in the first pixel circuit 100a may be greater than the first overlapping area Q12 of the first transistor T1 in the second pixel circuit 100b so that the capacitance value of the first parasitic capacitance CJ1 in the first pixel circuit 100a is greater than the capacitance value of the first parasitic capacitance CJ1 in the second pixel circuit 100b.

In conjunction with FIG. 8, according to some embodiments of the present application, optionally, the luminescence efficiency of the first color light-emitting element D1 may be less than the luminescence efficiency of the third color light-emitting element D3, and the luminescence efficiency of the third color light-emitting element D3 may be less than the luminescence efficiency of the second color light-emitting element D2.

According to some embodiments of the present application, optionally, the display panel may include a third pixel circuit 100c, where at least one of the first distance d1 of the first transistor T1 in the first pixel circuit 100a and the first distance d1 of the first transistor T1 in the second pixel circuit 100b may be different from a first distance d1 of the first transistor T1 in the third pixel circuit 100c, and/or at least one of the second distance d2 of the first transistor T1 in the first pixel circuit 100a and the second distance d2 of the first transistor T1 in the second pixel circuit 100b may be different from a second distance d2 of the first transistor T1 in the third pixel circuit 100c, and/or at least one of the third distance d3 of the first transistor T1 in the first pixel circuit 100a and the third distance d3 of the first transistor T1 in the second pixel circuit 100b may be different from a third distance d3 of the first transistor T1 in the third pixel circuit 100c.

For example, in some specific examples, the first distance d1 of the first transistor T1 in the first pixel circuit 100a may be greater than or equal to the first distance d1 of the first transistor T1 in the third pixel circuit 100c, and the first distance d1 of the first transistor T1 in the third pixel circuit 100c may be greater than or equal to the first distance d1 of the first transistor T1 in the second pixel circuit 100b; and/or the second distance d2 of the first transistor T1 in the first pixel circuit 100a may be greater than or equal to the second distance d2 of the first transistor T1 in the third pixel circuit 100c, and the second distance d2 of the first transistor T1 in the third pixel circuit 100c may be greater than or equal to the second distance d2 of the first transistor T1 in the second pixel circuit 100b; and/or the third distance d3 of the first transistor T1 in the first pixel circuit 100a may be greater than or equal to the third distance d3 of the first transistor T1 in the third pixel circuit 100c, and the third distance d3 of the first transistor T1 in the third pixel circuit 100c may be greater than or equal to the third distance d3 of the first transistor T1 in the second pixel circuit 100b.

In this manner, the first overlapping area Q11 of the first transistor T1 in the first pixel circuit 100a may be greater than or equal to the first overlapping area Q13 of the first transistor T1 in the third pixel circuit 100c, and the first overlapping area Q13 of the first transistor T1 in the third pixel circuit 100c may be greater than or equal to the first overlapping area Q12 of the first transistor T1 in the second pixel circuit 100b, so that the capacitance value of the first parasitic capacitance CJ1 in the first pixel circuit 100a is not less than the capacitance value of the first parasitic capacitance CJ1 in the third pixel circuit 100c and the capacitance value of the first parasitic capacitance CJ1 in the third pixel circuit 100c is not less than the capacitance value of the first parasitic capacitance CJ1 in the second pixel circuit 100b.

FIG. 15 is another sectional view of a threshold compensation device in a display panel according to an embodiment of the present application. As shown in FIG. 15, according to some embodiments of the present application, optionally, in a thickness direction Z of the display panel, the second gate g2 of the first transistor T1 may at least partially overlap the first electrode p1 of the first transistor T1. A second parasitic capacitance CJ2 exists between the second gate g2 of the first transistor T1 and the first electrode p1 of the first transistor T1.

According to some embodiments of the present application, optionally, the active layer 1001 may include a first region q1, a channel region qd and a second region q2 that are arranged in a first direction X. The first region q1 is electrically connected to the first electrode p1 of the first transistor T1, and the second region q2 is electrically connected to the second electrode p2 of the first transistor T1.

In a direction X1 that points to the first region q1 from the second region q2, an extension amount of the second gate g2 of the first transistor T1 relative to the first gate g1 of the first transistor T1 is a first extension amount L1.

For ease of description, a first extension amount of the first transistor T1 in the first pixel circuit 100a is represented by L11, and a first extension amount of the first transistor T1 in the second pixel circuit 100b is represented by L12.

The first extension amount L11 of the first transistor T1 in the first pixel circuit 100a may be greater than the first extension amount L12 of the first transistor T1 in the second pixel circuit 100b.

In this manner, since the first extension amount L11 of the first transistor T1 in the first pixel circuit 100a is greater than the first extension amount L12 of the first transistor T1 in the second pixel circuit 100b, a second parasitic capacitance CJ2 in the first pixel circuit 100a is greater than a second parasitic capacitance CJ2 in the second pixel circuit 100b, and/or a parasitic capacitance between a second gate g2 of the first transistor T1 in the first pixel circuit 100a and a metal at the first node N1 in the first pixel circuit 100a is greater than a parasitic capacitance between a second gate g2 of the first transistor T1 in the second pixel circuit 100b and a metal at the first node N1 in the second pixel circuit 100b. A capacitance value of the second parasitic capacitance CJ2 in the first pixel circuit and a capacitance value of the second parasitic capacitance CJ2 in the second pixel circuit are differently designed, and the potential of the first node in the first pixel circuit and the potential of the first node in the second pixel circuit may be differently adjusted, so that the drive current output by the drive circuit in the first pixel circuit and the drive current output by the drive circuit in the second pixel circuit can reach the target drive currents of the respective expected current values and the first color light-emitting element and the second color light-emitting element can reach or approach the respective expected target brightness, thereby improving the problem of color cast and improving the display effect of the display panel.

According to some embodiments of the present application, optionally, the display panel may include a third pixel circuit 100c. For ease of description, a first extension amount of the first transistor T1 in the third pixel circuit 100c is represented by L13.

The first extension amount L11 of the first transistor T1 in the first pixel circuit 100a may be greater than or equal to the first extension amount L13 of the first transistor T1 in the third pixel circuit 100c. The first extension amount L13 of the first transistor T1 in the third pixel circuit 100c may be greater than or equal to the first extension amount L12 of the first transistor T1 in the second pixel circuit 100b.

For example, in some specific examples, the first extension amount L11 of the first transistor T1 in the first pixel circuit 100a may be greater than the first extension amount L13 of the first transistor T1 in the third pixel circuit 100c. The first extension amount L13 of the first transistor T1 in the third pixel circuit 100c may be greater than or equal to the first extension amount L12 of the first transistor T1 in the second pixel circuit 100b.

For example, in some other specific examples, the first extension amount L11 of the first transistor T1 in the first pixel circuit 100a may be greater than or equal to the first extension amount L13 of the first transistor T1 in the third pixel circuit 100c. The first extension amount L13 of the first transistor T1 in the third pixel circuit 100c may be greater than the first extension amount L12 of the first transistor T1 in the second pixel circuit 100b.

In this manner, since the first extension amount L11 of the first transistor T1 in the first pixel circuit 100a is greater than or equal to the first extension amount L13 of the first transistor T1 in the third pixel circuit 100c and the first extension amount L13 of the first transistor T1 in the third pixel circuit 100c is greater than or equal to the first extension amount L12 of the first transistor T1 in the second pixel circuit 100b, the second parasitic capacitance CJ2 in the first pixel circuit 100a may be greater than or equal to a second parasitic capacitance CJ2 in the third pixel circuit 100c, and the second parasitic capacitance CJ2 in the third pixel circuit 100c may be greater than or equal to the second parasitic capacitance CJ2 in the second pixel circuit 100b, and/or the parasitic capacitance between the second gate g2 of the first transistor T1 in the first pixel circuit 100a and the metal at the first node N1 in the first pixel circuit 100a is greater than or equal to a parasitic capacitance between a second gate g2 of the first transistor T1 in the third pixel circuit 100c and a metal at the first node N1 in the third pixel circuit 100c, and the parasitic capacitance between the second gate g2 of the first transistor T1 in the third pixel circuit 100c and the metal at the first node N1 in the third pixel circuit 100c may be greater than or equal to the parasitic capacitance between the second gate g2 of the first transistor T1 in the second pixel circuit 100b and the metal at the first node N1 in the second pixel circuit 100b.

As shown in FIG. 15, according to some embodiments of the present application, optionally, in a direction X2 that points to the second region q2 from the first region q1, an extension amount of the second gate g2 of the first transistor T1 relative to the first gate g1 of the first transistor T1 is a second extension amount L2, and the first extension amount L1 may be greater than or equal to the second extension amount L2.

In this manner, it is conducive to increasing the second parasitic capacitance CJ2 between the second gate g2 of the first transistor T1 and the first electrode p1 of the first transistor T1.

As shown in FIG. 15, according to some embodiments of the present application, optionally, in a thickness direction Z of the display panel, an orthographic projection of a second gate g2 of a first transistor T1 in the first pixel circuit 100a on a substrate 01 of the display panel may completely cover an orthographic projection of a first electrode g1 of the first transistor T1 in the first pixel circuit 100a on the substrate 01 of the display panel.

In this manner, the second parasitic capacitance CJ2 in the first pixel circuit 100a may be increased to a greater extent so that an absolute value of a coupling voltage ΔV of the first pixel circuit 100a is increased to a greater extent, the drive current output by the first pixel circuit 100a is increased to a greater extent and the brightness of the first color light-emitting element is improved.

Figure 16:
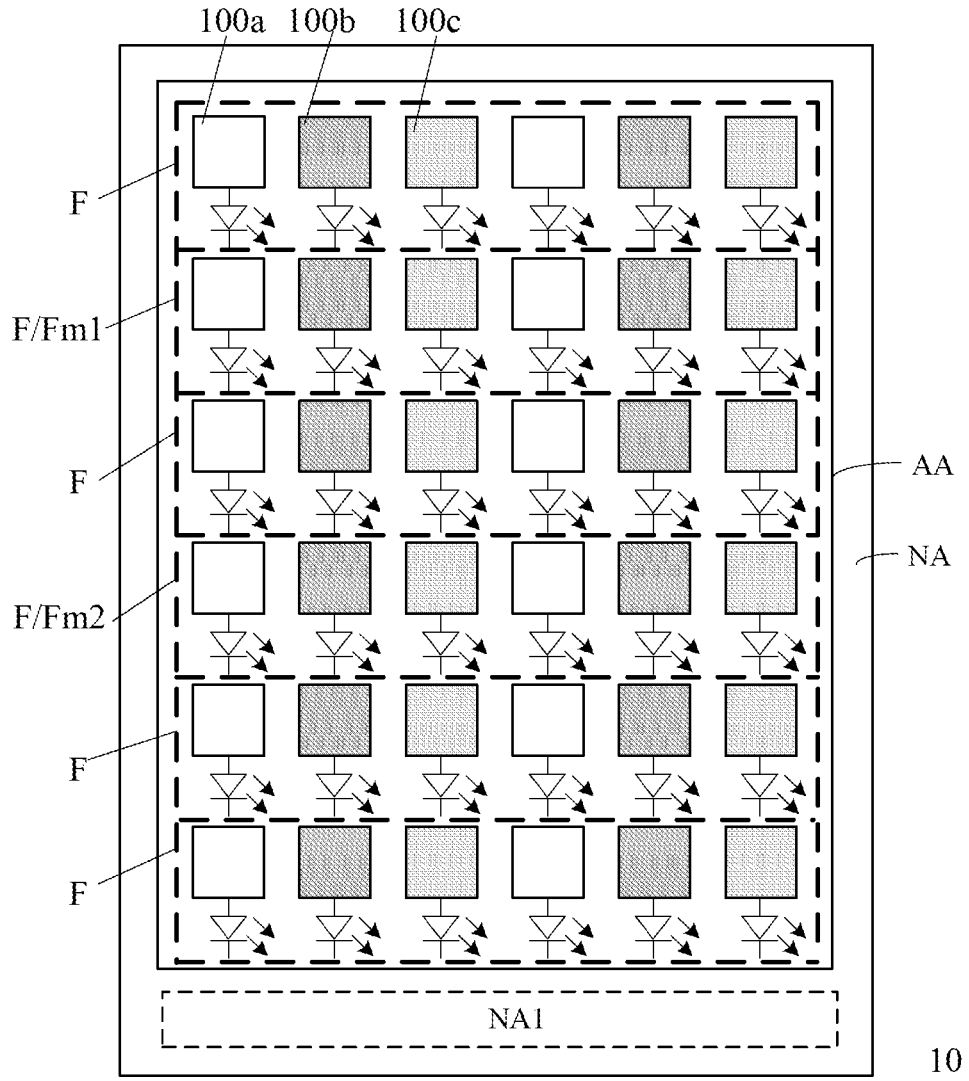
FIG. 16 is a structure diagram of a display panel according to an embodiment of the present application.

FIG. 16 is a structure diagram of a display panel according to an embodiment of the present application. As shown in FIG. 16, according to some embodiments of the present application, optionally, the display panel 10 may include a display region AA and a non-display region NA, where the display region AA may include a plurality of partitions F, where at least one first pixel circuit 100$a$ and at least one second pixel circuit 100$b$ are disposed in each of the plurality of partitions F.

In conjunction with FIGS. 2 and 16, coupling devices 102 of first pixel circuits 100$a$ in at least two of the plurality of partitions F may have the same capacitance value or different capacitance values, and/or coupling devices 102 of second pixel circuits 100$b$ in at least two of the plurality of partitions F may have the same capacitance value or different capacitance values.

For example, in some specific examples, coupling devices 102 of first pixel circuits 100$a$ in at least two of the plurality of partitions F may have different capacitance values, and/or coupling devices 102 of second pixel circuits 100$b$ in at least two of the plurality of partitions F may have different capacitance values.

First power voltage signals (i.e., positive power voltage signals) received by pixel circuits in at least two of the plurality of partitions F may have different voltage values due to an effect of IR-drop, capacitance values of coupling devices in first pixel circuits and/or second pixel circuits in the at least two of the plurality of partitions F are differently designed, and potentials of first nodes in the first pixel circuits and/or the second pixel circuits in the at least two of the plurality of partitions F may be differently adjusted, so that drive currents output by drive circuits in the first pixel circuits and/or the second pixel circuits in the at least two of the plurality of partitions F reach or approach target drive currents of expected current values and brightness of first color light-emitting elements and/or second color light-emitting elements in the at least two of the plurality of partitions F may be the same or similar, thereby improving display uniformity and improving the display effect of the display panel.

As shown in FIG. 16, according to some embodiments of the present application, optionally, at least one third pixel circuit 100$c$ may be further disposed in each of the plurality of partitions F. Coupling devices 102 of third pixel circuits 100$c$ in at least two of the plurality of partitions F may have the same capacitance value or different capacitance values.

As shown in FIG. 16, according to some embodiments of the present application, optionally, the non-display region NA may include a bonding region NA1, where a bonding pad is disposed in the bonding region NA1 and configured to be electrically connected to a driver chip or a flexible circuit board.

The plurality of partitions F may include a first partition Fm1 and a second partition Fm2, where the first partition Fm1 may be located on a side of the second partition Fm2 facing away from the bonding region NA1.

A capacitance value of a coupling device 102 of a first pixel circuit 100$a$ in the first partition Fm1 may be greater than a capacitance value of a coupling device 102 of a first pixel circuit 100$a$ in the second partition Fm2, and/or a capacitance value of a coupling device 102 of a second pixel circuit 100$b$ in the first partition Fm1 is greater than a capacitance value of a coupling device 102 of a second pixel circuit 100$b$ in the second partition Fm2.

A voltage value of a first power voltage signal (a positive power voltage signal) received by a pixel circuit in the first partition Fm1 may be relatively low compared with the second partition Fm2 due to the effect of IR-drop. The capacitance value of the coupling device 102 of the first pixel circuit 100$a$ in the first partition Fm1 is greater than the capacitance value of the coupling device 102 of the first pixel circuit 100$a$ in the second partition Fm2, and/or the capacitance value of the coupling device 102 of the second pixel circuit 100$b$ in the first partition Fm1 is greater than the capacitance value of the coupling device 102 of the second pixel circuit 100$b$ in the second partition Fm2. In this manner, it is conducive to enabling a drive current output by a drive circuit in the first pixel circuit in the first partition Fm1 to be the same as or similar to a drive current output by a drive circuit in the first pixel circuit in the second partition Fm2 and/or enabling a drive current output by a drive circuit in the second pixel circuit in the first partition Fm1 to be the same as or similar to a drive current output by a drive circuit in the second pixel circuit in the second partition Fm2, thereby improving the display uniformity and improving the display effect of the display panel.

Figure 17:
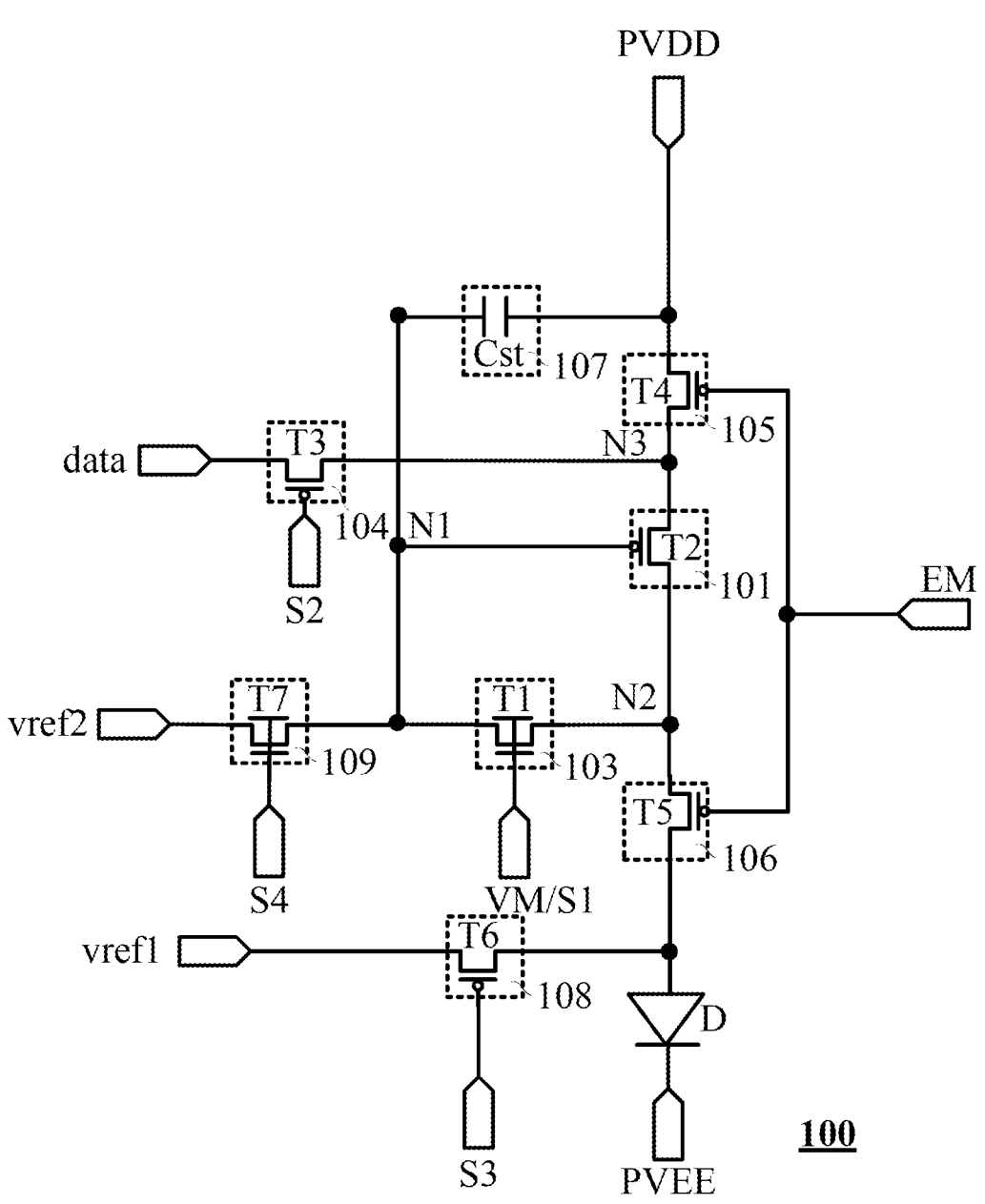
FIG. 17 is another circuit diagram of a pixel circuit in a display panel according to an embodiment of the present application.

FIG. 17 is another circuit diagram of a pixel circuit in a display panel according to an embodiment of the present application. As shown in FIG. 17, according to some embodiments of the present application, optionally, the pixel circuit 100 may include a drive circuit 101, a threshold compensation device 103, a data write device 104, a first light emission control device 105, a second light emission control device 106, a storage device 107, a first reset device 108 and a second reset device 109.

A control terminal of the drive circuit 101 is electrically connected to a first node N1, a first terminal of the drive circuit 101 is electrically connected to a second node N2, and a second terminal of the drive circuit 101 is electrically connected to a third node N3.

A control terminal of the threshold compensation device 103 is electrically connected to a first scan signal line S1, a first terminal of the threshold compensation device 103 is electrically connected to the first node N1, and a second terminal of the threshold compensation device 103 is electrically connected to the second node N2. The threshold compensation device 103 may be configured to be turned on under control of the first scan signal line S1 and connect the first node N1 to the second node N2, thereby compensating a threshold voltage Vth of the drive circuit 101.

The coupling device 102 may include a parasitic capacitance CJ of the threshold compensation device 103, and the target voltage signal line VM may include the first scan signal line S1.

A control terminal of the data write device 104 is electrically connected to a second scan signal line S2, a first terminal of the data write device 104 is electrically connected to a data signal line data, and a second terminal of the data write device 104 is electrically connected to the first node N1. The data write device 104 may be configured to be turned on under control of the second scan signal line S2 and write a data signal of the data signal line data to the first node N1.

A control terminal of the first light emission control device 105 is electrically connected to a light emission control signal EM, a first terminal of the first light emission control device 105 is electrically connected to a first power voltage signal line PVDD, and a second terminal of the first light emission control device 105 is electrically connected to the third node N3.

A control terminal of the second light emission control device 106 is electrically connected to the light emission control signal EM, a first terminal of the second light emission control device 106 is electrically connected to the second node N2, and a second terminal of the second light emission control device 106 is electrically connected to a first electrode of a light-emitting element D. For example, the first electrode of the light-emitting element D may be an anode of the light-emitting element D, and a second electrode of the light-emitting element D may be a cathode of the light-emitting element D.

A first plate of the storage device 107 is electrically connected to the first power voltage signal line PVDD, and a second plate of the storage device 107 is electrically connected to the first node N1.

A control terminal of the first reset device 108 is electrically connected to a third scan signal line S3, a first terminal of the first reset device 108 is electrically connected to a first reset signal line vref1, and a second terminal of the first reset device 108 is electrically connected to the first electrode of the light-emitting element D. The first reset device 108 may be configured to transmit a first reset signal of the first reset signal line vref1 to the first electrode of the light-emitting element D under control of the third scan signal line S3 to reset the first electrode of the light-emitting element D.

A control terminal of the second reset device 109 is electrically connected to a fourth scan signal line S4, a first terminal of the second reset device 109 is electrically connected to a second reset signal line vref2, and a second terminal of the second reset device 109 is electrically connected to the first node N1. The second reset device 109 is configured to be turned on under control of the fourth scan signal line S4 and transmit a second reset signal of the second reset signal line vref2 to the first node N1 to reset the first node N1.

In some specific examples, optionally, the threshold compensation device 103 may include a first transistor T1, the drive circuit 101 may include a second transistor T2, the data write device 104 may include a third transistor T3, the first light emission control device 105 may include a fourth transistor T4, the second light emission control device 106 may include a fifth transistor T6, the first reset device 108 may include a sixth transistor T6, the second reset device 109 may include a seventh transistor T7, and the storage device 107 may include a storage capacitor Cst. In some embodiments, the first transistor T1 and the seventh transistor T7 may be double-gate transistors.

A type of the transistor of the threshold compensation device 103 may be different from a type of the transistor of the drive circuit 101. As shown in FIG. 17, in some embodiments, the threshold compensation device 103 may be an n-type transistor, and the drive circuit 101 may be a p-type transistor. Of course, in some other embodiments, the threshold compensation device 103 is a p-type transistor, and the drive circuit 101 may be an n-type transistor.

Figure 18:
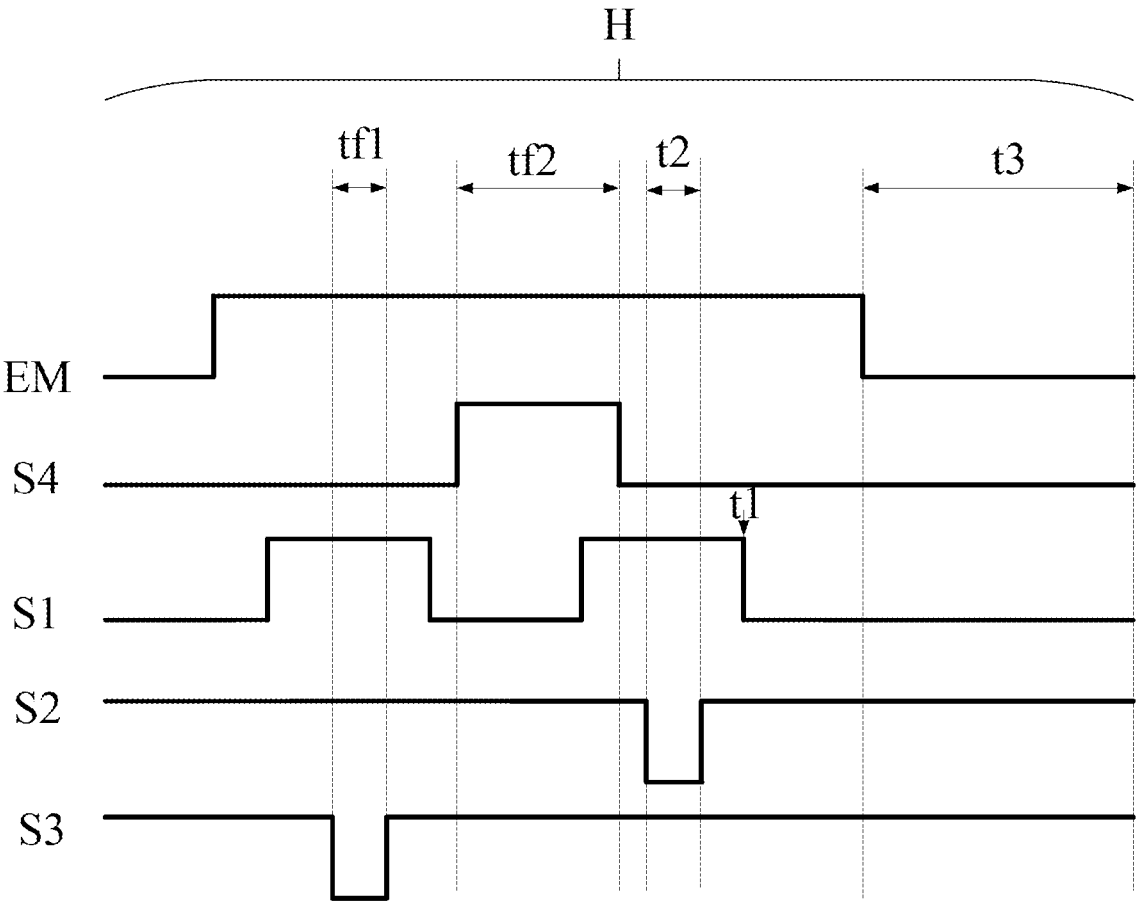
FIG. 18 is another drive timing diagram of a pixel circuit in a display panel according to an embodiment of the present application.

FIG. 18 is another drive timing diagram of a pixel circuit in a display panel according to an embodiment of the present application. In conjunction with FIGS. 17 and 18, In FIG. 18, the case where on levels of the threshold compensation device 103 and the second reset device 109 are high levels and on levels of other transistors are low levels is used as an example for illustration. In some embodiments, one image refresh period H of the pixel circuit 100 may include a first reset stage tf1, a second reset stage tf2, a data write stage t2, a coupling stage t1 and a light emission stage t3.

In the first reset stage tf1, the first reset device 108 may transmit the first reset signal of the first reset signal line vref1 to the first electrode of the light-emitting element D under the control of the third scan signal line S3 to reset the first electrode of the light-emitting element D.

In the second reset stage tf2, the second reset device 109 may be turned on under the control of the fourth scan signal line S4 and transmit the second reset signal of the second reset signal line vref2 to the first node N1 to reset the first node N1.

In the data write stage t2, the threshold compensation device 103 may be turned on under the control of the first scan signal line S1, the data write device 104 may be turned on under the control of the second scan signal line S2, the data signal of the data signal line data is written to the first node N1 via the data write device 104, the drive circuit 101 and the threshold compensation device 103 in sequence, and the threshold voltage Vth of the drive circuit 101 is compensated. In this case, it is assumed that a potential of the first node N1 is Vdata−Vth. Vdata denotes a data voltage, that is, a voltage of the data signal, and Vth denotes the threshold voltage Vth of the drive circuit 101.

The case where the drive circuit 101 is the p-type transistor is used as an example. In the coupling stage t1, a potential of the first scan signal line S1 may be switched from a high level to a low level, and the parasitic capacitance CJ of the threshold compensation device 103 may pull down the potential of the first node N1 in response to a potential variation of the first scan signal line S1. The potential of the first node N1 is pulled down to Vdata−Vth−ΔV.

In the light emission stage t3, the first light emission control device 105 and the second light emission control device 106 are turned on under control of the light emission control signal EM, and the drive circuit 101 may output a drive current based on the potential of the first node N1 that is pulled down to Vdata−Vth−ΔV.

Compared with the potential Vdata−Vth of the first node N1 that is not pulled down, the potential Vdata−Vth−ΔV of the first node N1 that is pulled down is lower. Therefore, the drive circuit 101 may output a larger drive current, and brightness of the light-emitting element D is increased, so that the brightness of the light-emitting element D reaches or approaches expected target brightness.

Figure 19:
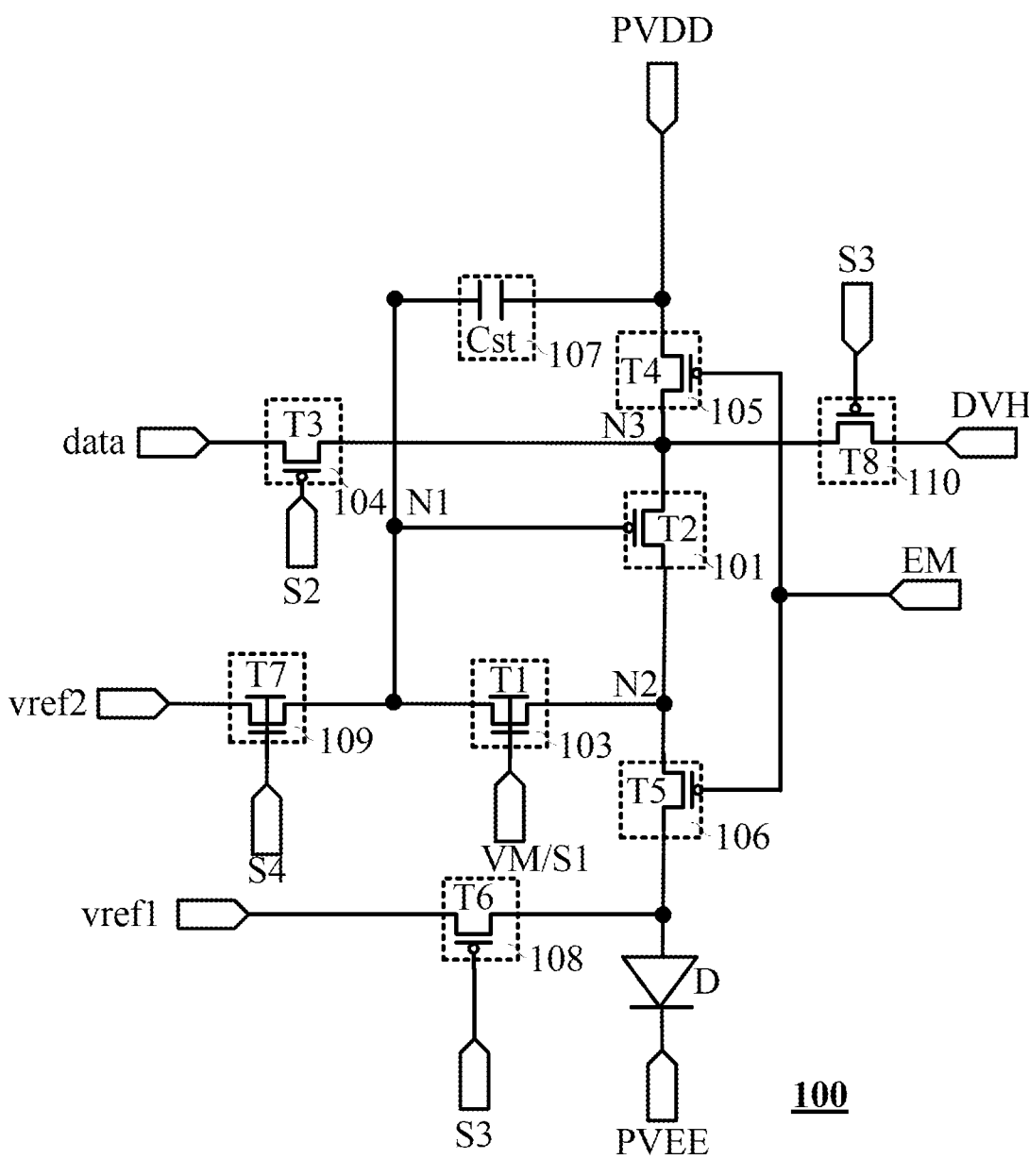
FIG. 19 is another circuit diagram of a pixel circuit in a display panel according to an embodiment of the present application.

FIG. 19 is another circuit diagram of a pixel circuit in a display panel according to an embodiment of the present application. As shown in FIG. 19, different from the embodiment shown in FIG. 17, according to some other embodiments of the present application, optionally, the pixel circuit 100 may further include a bias compensation device 110, where a control terminal of the bias compensation device 110 is electrically connected to the third scan signal line S3, a first terminal of the bias compensation device 110 is electrically connected to a bias voltage signal line DVH, and a second terminal of the bias compensation device 110 is electrically connected to the second node N2 or the third node N3. In FIG. 19, the case where the second terminal of the bias compensation device 110 is electrically connected to the third node N3 is used as an example for illustration. The bias compensation device 110 is configured to transmit a bias voltage signal of the bias voltage signal line DVH to the second node N2 or the third node N3 under the control of the third scan signal line S3. In some examples, the bias compensation device 110 may include an eighth transistor T8.

Figure 20:
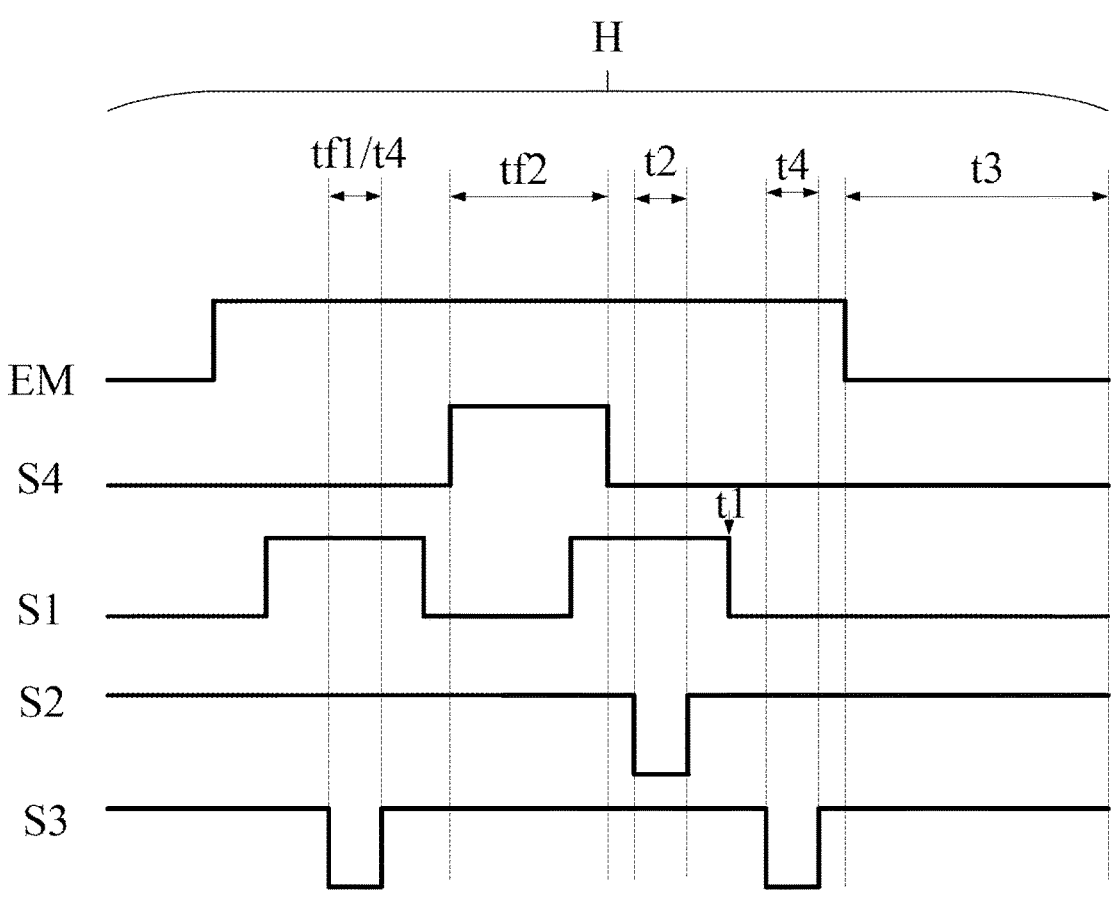
FIG. 20 is another drive timing diagram of a pixel circuit in a display panel according to an embodiment of the present application.

FIG. 20 is another drive timing diagram of a pixel circuit in a display panel according to an embodiment of the present application. In conjunction with FIGS. 19 and 20, different from the embodiment shown in FIG. 18, according to some other embodiments of the present application, optionally, one image refresh period H of the pixel circuit 100 may further include at least one bias compensation stage t4.

In the first reset stage tf1, the first reset device 108 may transmit the first reset signal of the first reset signal line vref1 to the first electrode of the light-emitting element D under the control of the third scan signal line S3 to reset the first electrode of the light-emitting element D. The bias compensation device 110 may transmit the bias voltage signal of the bias voltage signal line DVH to the second node N2 or the third node N3 under the control of the third scan signal line S3.

In the bias compensation stage t4, the bias compensation device 110 may transmit the bias voltage signal of the bias voltage signal line DVH to the second node N2 or the third node N3 under the control of the third scan signal line S3.

Figure 21:
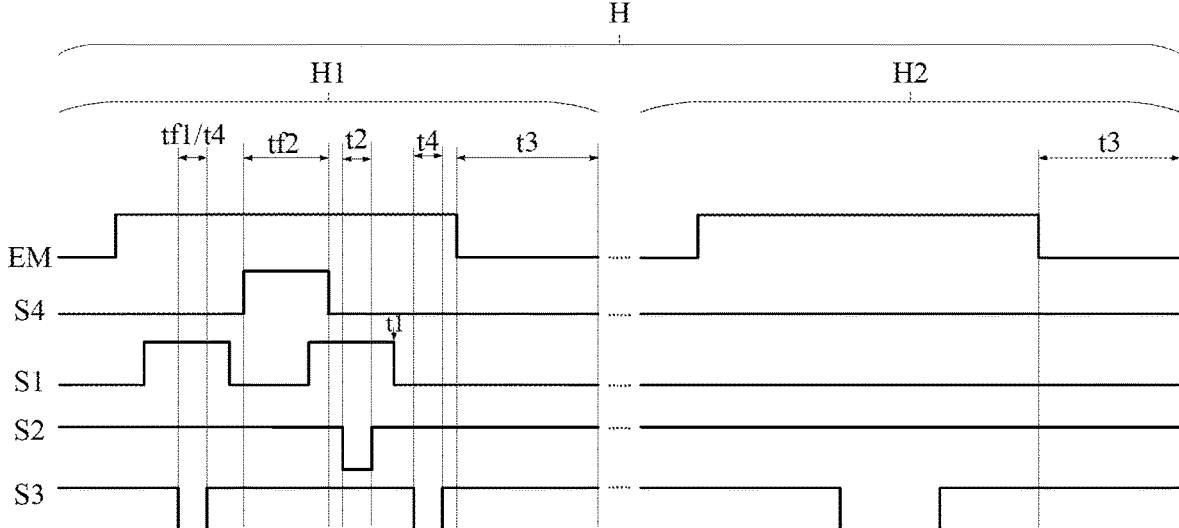
FIG. 21 is another drive timing diagram of a pixel circuit in a display panel according to an embodiment of the present application.

FIG. 21 is another drive timing diagram of a pixel circuit in a display panel according to an embodiment of the present application. As shown in FIG. 21, different from the embodiment shown in FIG. 20, according to some other embodiments of the present application, optionally, for example, when the display panel is at a low frequency, one image refresh period H of the pixel circuit 100 may include a write frame H1 and at least one retention frame H2. In conjunction with FIGS. 19 and 21, in the write frame H1, the potential of the first node N1 may be refreshed. In the retention frame H2, the potential of the first node N1 is not refreshed. The write frame H1 may include at least the preceding data write stage t2, coupling stage t1 and light emission stage t3. In some examples, the write frame H1 may further include the preceding first reset stage tf1, second reset stage tf2 and bias compensation stage t4. The retention frame H2 may not include the first reset stage tf1, the second reset stage tf2, the data write stage t2 and the coupling stage t1.

Figure 22:
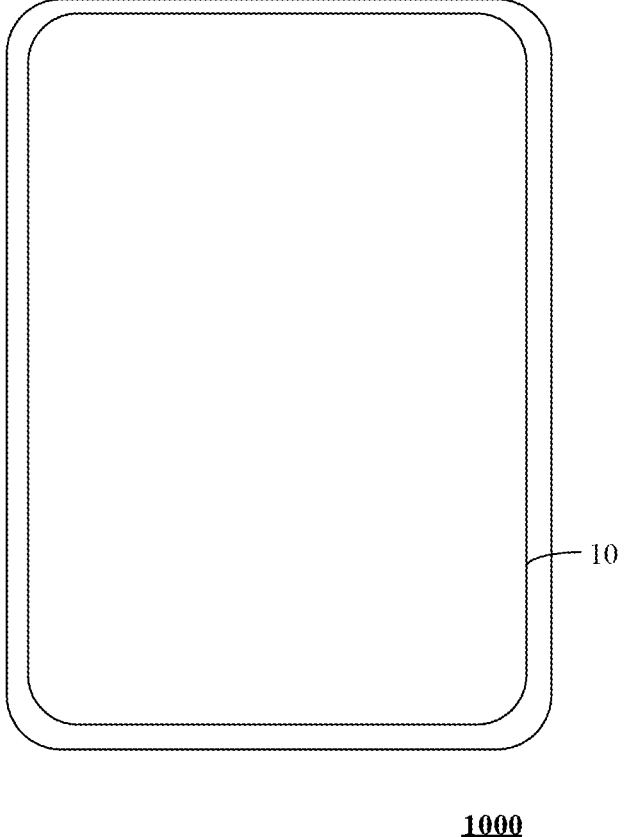
FIG. 22 is a structure diagram of a display device according to an embodiment of the present application.

Based on the display panel provided in the preceding embodiments, correspondingly, the present application further provides a display device including the display panel provided in the present application. Referring to FIG. 22, FIG. 22 is a structure diagram of a display device according to an embodiment of the present application. The display device 1000 provided in FIG. 22 includes the display panel 10 provided in any preceding embodiment of the present application. In the embodiment of FIG. 22, the case where the display device 1000 is a mobile phone is used as an example for description. It is to be understood that the display device provided in the embodiment of the present application may be a wearable product, a computer, a television, an in-vehicle display device, or another display device with a display function, which is not specifically limited in the present application. The display device provided in the embodiment of the present application has the beneficial effects of the display panel 10 provided in the embodiment of the present application. For details, reference may be made to the specific description of the display panel 10 in the preceding embodiments, and the details are not repeated here in the embodiment of the present application.

It is to be understood that the specific structure of the circuit and the cross-sectional structure of the display panel provided in the drawings of the embodiments of the present application are merely some examples and are not intended to limit the present application. In addition, the preceding embodiments provided in the present application may be combined with each other if there is no contradiction.

It is to be noted that the various embodiments in this specification are described in a progressive manner. The same or similar parts in the various embodiments are referred to each other. Each embodiment focuses on differences from the other embodiments. According to the preceding embodiments of the present application, these embodiments do not describe all details, nor do they limit the present application to only the specific embodiments described. Apparently, many modifications and variations are possible in light of the preceding description. These embodiments have been chosen and described in detail in the specification in order to better explain the principle and practical application of the present application, thereby enabling those skilled in the art to make better use of the present application and its modifications. The present application is limited only by the claims and their full scope and equivalents.

Those skilled in the art should understand that the preceding embodiments are illustrative rather than restrictive. Different technical features in different embodiments can be combined to achieve the beneficial effects. Those skilled in the art should be able to understand and implement other modified embodiments of the disclosed embodiments on the basis of studying the drawings, specification, and claims. In the claims, the term "comprising" does not exclude other structures; the number refers to "one" but does not exclude "a plurality"; and the terms "first" and "second" are used to indicate names rather than to indicate any specific order. Any reference numeral in the claims should not be construed as limiting the scope. The appearance of certain technical features in different dependent claims does not mean that these technical features cannot be combined to achieve the beneficial effects.

What is claimed is:

1. A display panel, comprising a light-emitting element and a pixel circuit, wherein the pixel circuit comprises:
   a drive circuit, wherein a control terminal of the drive circuit is electrically connected to a first node; and
   a coupling device, wherein a first terminal of the coupling device is electrically connected to a target voltage signal line, and a second terminal of the coupling device is electrically connected to the first node;
   wherein the light-emitting element comprises a first color light-emitting element and a second color light-emitting element, and the pixel circuit comprises a first pixel circuit and a second pixel circuit, wherein the first pixel circuit is electrically connected to the first color light-emitting element, the second pixel circuit is electrically connected to the second color light-emitting element, and a capacitance value of a coupling device in the first pixel circuit is different from a capacitance value of a coupling device in the second pixel circuit;
   wherein the pixel circuit further comprises:
   a threshold compensation device, wherein a control terminal of the threshold compensation device is electrically connected to a first scan signal line, a first terminal of the threshold compensation device is electrically connected to the first node, and a second terminal of the threshold compensation device is electrically connected to a first terminal of the drive circuit;
   and the coupling device comprises a parasitic capacitance of the threshold compensation device, and the target voltage signal line comprises the first scan signal line;
   wherein the threshold compensation device comprises a first transistor, wherein the first transistor comprises a first gate, a first electrode, a second electrode and an active layer,
   wherein the first electrode and the second electrode of the first transistor are separately electrically connected to the active layer;

the first gate of the first transistor is electrically connected to the first scan signal line, and the first electrode of the first transistor is electrically connected to the first node; and the parasitic capacitance comprises a first parasitic capacitance between the first gate and the active layer.

2. The display panel according to claim 1, wherein the drive circuit comprises a p-type transistor, and in a coupling stage, a potential of the target voltage signal line is switched from a high level to a low level, and the coupling device is configured to pull down a potential of the first node in response to a potential variation of the target voltage signal line.

3. The display panel according to claim 2, wherein one image refresh period of the pixel circuit comprises a data write stage and a light emission stage, wherein the first node is configured to be written a data signal to in the data write stage, and the pixel circuit is configured to drive the light-emitting element to emit light in the light emission stage; and the coupling stage is located after the data write stage and before the light emission stage.

4. The display panel according to claim 3, wherein one image refresh period of the pixel circuit comprises a write frame and a retention frame, wherein in the write frame, the potential of the first node is refreshed, and in the retention frame, the potential of the first node is not refreshed; and the data write stage, the coupling stage and the light emission stage are located in the write frame.

5. The display panel according to claim 1, wherein the drive circuit comprises an n-type transistor, and a potential of the target voltage signal line is configured to be switched from a low level to a high level in a coupling stage, and the coupling device is configured to pull up a potential of the first node in response to a potential variation of the target voltage signal line.

6. The display panel according to claim 1, wherein a first plate of the parasitic capacitance is electrically connected to the target voltage signal line, and a second plate of the parasitic capacitance is electrically connected to the first node.

7. The display panel according to claim 1, wherein luminescence efficiency of the first color light-emitting element is less than luminescence efficiency of the second color light-emitting element, and the capacitance value of the coupling device in the first pixel circuit is greater than the capacitance value of the coupling device in the second pixel circuit.

8. The display panel according to claim 1, wherein the light-emitting element further comprises a third color light-emitting element, and the pixel circuit further comprises a third pixel circuit, wherein the third pixel circuit is electrically connected to the third color light-emitting element; and at least one of the capacitance value of the coupling device in the first pixel circuit and the capacitance value of the coupling device in the second pixel circuit is different from a capacitance value of a coupling device in the third pixel circuit.

9. The display panel according to claim 8, wherein luminescence efficiency of the first color light-emitting element is less than luminescence efficiency of the third color light-emitting element, and the luminescence efficiency of the third color light-emitting element is less than luminescence efficiency of the second color light-emitting element; and the capacitance value of the coupling device in the first pixel circuit is not less than the capacitance value of the coupling device in the third pixel circuit, and the capacitance value of the coupling device in the third pixel circuit is not less than the capacitance value of the coupling device in the second pixel circuit.

10. The display panel according to claim 1, wherein the active layer comprises a first region, a channel region and a second region that are arranged in a first direction, wherein the first region is electrically connected to the first electrode of the first transistor, and the second region is electrically connected to the second electrode of the first transistor;

in a thickness direction of the display panel, an overlapping area between the first gate and the channel region is a first overlapping area; and a first overlapping area of a first transistor in the first pixel circuit is different from a first overlapping area of a first transistor in the second pixel circuit.

11. The display panel according to claim 10, wherein a distance of the channel region in the first direction is a first distance, a distance of the first gate in a second direction is a second distance, and the second direction intersects the first direction; and a first distance of the first transistor in the first pixel circuit is greater than a first distance of the first transistor in the second pixel circuit, and/or a second distance of the first transistor in the first pixel circuit is greater than a second distance of the first transistor in the second pixel circuit.

12. The display panel according to claim 1, wherein the first transistor further comprises a second gate;

the second gate of the first transistor is electrically connected to the first scan signal line.

13. The display panel according to claim 12, wherein the active layer comprises a first region, a channel region and a second region that are arranged in a first direction, wherein the first region is electrically connected to the first electrode of the first transistor, and the second region is electrically connected to the second electrode of the first transistor;

in a thickness direction of the display panel, an overlapping area between the first gate and the channel region is a first overlapping area, and an overlapping area of the second gate and the channel region is a second overlapping area; and a first overlapping area of a first transistor in the first pixel circuit is different from a first overlapping area of a first transistor in the second pixel circuit, and/or a second overlapping area of the first transistor in the first pixel circuit is different from a second overlapping area of the first transistor in the second pixel circuit.

14. The display panel according to claim 13, wherein a distance of the channel region in the first direction is a first distance, a distance of the first gate in a second direction is a second distance, a distance of the second gate in the second direction is a third distance, and the second direction intersects the first direction; and a first distance of the first transistor in the first pixel circuit is greater than or equal to a first distance of the first transistor in the second pixel circuit, and/or a second distance of the first transistor in the first pixel circuit is greater than or equal to a second distance of the first transistor in the second pixel circuit, and/or a third distance of the first transistor in the first pixel circuit is greater than or equal to a third distance of the first transistor in the second pixel circuit.

15. The display panel according to claim 14, wherein the light-emitting element further comprises a third color light-emitting element, and the pixel circuit further comprises a third pixel circuit, wherein the third pixel circuit is electrically connected to the third color light-emitting element;

the first distance of the first transistor in the first pixel circuit is greater than or equal to a first distance of a first transistor in the third pixel circuit, and/or the second distance of the first transistor in the first pixel circuit is greater than or equal to a second distance of the first transistor in the third pixel circuit, and/or the third distance of the first transistor in the first pixel circuit is greater than or equal to a third distance of the first transistor in the third pixel circuit; and the first distance of the first transistor in the third pixel circuit is greater than or equal to the first distance of the first transistor in the second pixel circuit, and/or the second distance of the first transistor in the third pixel circuit is greater than or equal to the second distance of the first transistor in the second pixel circuit, and/or the third distance of the first transistor in the third pixel circuit is greater than or equal to the third distance of the first transistor in the second pixel circuit.

16. The display panel according to claim 12, wherein in a thickness direction of the display panel, the second gate of the first transistor at least partially overlaps the first electrode of the first transistor.

17. The display panel according to claim 16, wherein the active layer comprises a first region, a channel region and a second region that are arranged in a first direction, wherein the first region is electrically connected to the first electrode of the first transistor, and the second region is electrically connected to the second electrode of the first transistor;

in a direction that points to the first region from the second region, an extension amount of the second gate relative to the first gate is a first extension amount; and a first extension amount of a first transistor in the first pixel circuit is greater than or equal to a first extension amount of a first transistor in the second pixel circuit.

18. The display panel according to claim 17, wherein the light-emitting element further comprises a third color light-emitting element, and the pixel circuit further comprises a third pixel circuit, wherein the third pixel circuit is electrically connected to the third color light-emitting element;

the first extension amount of the first transistor in the first pixel circuit is greater than or equal to a first extension amount of a first transistor in the third pixel circuit; and the first extension amount of the first transistor in the third pixel circuit is greater than or equal to the first extension amount of the first transistor in the second pixel circuit.

19. The display panel according to claim 17, wherein in a direction that points to the second region from the first region, the extension amount of the second gate relative to the first gate is a second extension amount, and the first extension amount is greater than or equal to the second extension amount.

20. The display panel according to claim 12, wherein in a thickness direction of the display panel, an orthographic projection of a second gate of a first transistor in the first pixel circuit on a substrate of the display panel completely covers an orthographic projection of a first electrode of the first transistor in the first pixel circuit on the substrate of the display panel.

21. The display panel according to claim 12, wherein the parasitic capacitance further comprises: a second parasitic capacitance between the second gate and the first electrode, and/or a third parasitic capacitance between the second gate and the active layer.

22. The display panel according to claim 1, wherein the drive circuit comprises a p-type transistor, and the threshold compensation device comprises an n-type transistor; or, the drive circuit comprises an n-type transistor, and the threshold compensation device comprises a p-type transistor.

23. The display panel according to claim 1, wherein the display panel comprises a display region and a non-display region, wherein the display region comprises a plurality of partitions, wherein at least one first pixel circuit and at least one second pixel circuit are disposed in each of the plurality of partitions;

coupling devices of first pixel circuits in at least two of the plurality of partitions have a same capacitance value or different capacitance values; and/or coupling devices of second pixel circuits in at least two of the plurality of partitions have a same capacitance value or different capacitance values.

24. The display panel according to claim 23, wherein the non-display region comprises a bonding region, wherein a bonding pad is disposed in the bonding region and configured to be electrically connected to a driver chip or a flexible circuit board;

the plurality of partitions comprise a first partition and a second partition, wherein the first partition is located on a side of the second partition facing away from the bonding region; and a capacitance value of a coupling device of a first pixel circuit in the first partition is greater than a capacitance value of a coupling device of a first pixel circuit in the second partition, and/or a capacitance value of a coupling device of a second pixel circuit in the first partition is greater than a capacitance value of a coupling device of a second pixel circuit in the second partition.

* * * * *